US012328863B2

United States Patent
Dai et al.

(10) Patent No.: US 12,328,863 B2
(45) Date of Patent: Jun. 10, 2025

(54) TRANSISTOR, 3D MEMORY AND MANUFACTURING METHOD THEREFOR, AND ELECTRONIC DEVICE

(71) Applicant: BEIJING SUPERSTRING ACADEMY OF MEMORY TECHNOLOGY, Beijing (CN)

(72) Inventors: Jin Dai, Beijing (CN); Yong Yu, Beijing (CN); Jing Liang, Beijing (CN)

(73) Assignee: BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 0 days.

(21) Appl. No.: 18/304,219

(22) Filed: Apr. 20, 2023

(65) Prior Publication Data

US 2024/0130106 A1 Apr. 18, 2024

Related U.S. Application Data

(63) Continuation of application No. PCT/CN2022/137325, filed on Dec. 7, 2022.

(30) Foreign Application Priority Data

Oct. 18, 2022 (CN) .......................... 202211270027.3

(51) Int. Cl.
*H10B 12/00* (2023.01)
*H10D 30/67* (2025.01)

(52) U.S. Cl.
CPC ............. *H10B 12/30* (2023.02); *H10B 12/05* (2023.02)

(58) Field of Classification Search
CPC ...... H10B 12/30; H10B 12/05; H10B 12/488; H10B 12/00; H10B 12/01;
(Continued)

(56) References Cited

U.S. PATENT DOCUMENTS

2005/0184348 A1 8/2005 Youn et al.
2008/0310213 A1 12/2008 Chen et al.
(Continued)

FOREIGN PATENT DOCUMENTS

CN 112635463 A 4/2021
CN 114203639 A 3/2022
(Continued)

OTHER PUBLICATIONS

International Search Report and Written Opinion for International Application No. PCT/CN2022/137325, dated Jun. 2, 2023, 14 Pages (including English Translation).

(Continued)

*Primary Examiner* — Joshua Benitez Rosario
*Assistant Examiner* — John Lin
(74) *Attorney, Agent, or Firm* — BROOKS KUSHMAN P.C.

(57) ABSTRACT

A transistor, a 3D memory and a manufacturing method therefor, and an electronic device are provided in the present application. The 3D memory includes a plurality of layers of memory cells stacked in a direction perpendicular to a substrate, and a word line. A memory cell includes a transistor which includes a source and a drain, a gate extending in the direction perpendicular to the substrate, a semiconductor layer surrounding a sidewall of the gate. The semiconductor layer includes a source contact region and a drain contact region arranged at intervals. A channel between the source contact region and the drain contact region is a horizontal channel, and the word line extends in the direction perpendicular to the substrate and penetrates through the memory cells of different layers.

13 Claims, 16 Drawing Sheets

(58) Field of Classification Search
CPC ........... H01L 29/78642; H01L 29/7869; H01L 29/78693; H01L 29/78696; H01L 27/0688; H10D 30/6728; H10D 30/6755; H10D 30/6756; H10D 30/6757; H10D 88/00

See application file for complete search history.

(56) References Cited

U.S. PATENT DOCUMENTS

| | | | |
|---|---|---|---|
| 2019/0006376 A1* | 1/2019 | Ramaswamy | H10B 12/30 |
| 2020/0091263 A1* | 3/2020 | Wang | H01L 29/41733 |
| 2020/0203427 A1* | 6/2020 | Noh | H10B 43/10 |
| 2021/0104527 A1 | 4/2021 | Son | |
| 2021/0399051 A1* | 12/2021 | Wu | H10B 63/34 |
| 2022/0068933 A1 | 3/2022 | Smythe, III et al. | |
| 2022/0122977 A1* | 4/2022 | Kim | H10B 12/30 |
| 2022/0392901 A1 | 12/2022 | Liu et al. | |

FOREIGN PATENT DOCUMENTS

| | | |
|---|---|---|
| CN | 114334980 A | 4/2022 |
| CN | 114446963 A | 5/2022 |
| CN | 114709211 A | 7/2022 |
| CN | 114864583 A | 8/2022 |
| CN | 115020480 A | 9/2022 |
| CN | 115346987 A | 11/2022 |
| CN | 115346988 A | 11/2022 |

OTHER PUBLICATIONS

First Office Action for Chinese Application No. 202211270027.3, dated Nov. 22, 2022, 15 Pages (including English Translation).

* cited by examiner

TRANSISTOR, 3D MEMORY AND MANUFACTURING METHOD THEREFOR, AND ELECTRONIC DEVICE

CROSS-REFERENCE TO RELATED APPLICATIONS

This application is a continuation of International PCT Application No. PCT/CN2022/137325 filed Dec. 7, 2022, which claims the priority to Chinese Patent Application No. 202211270027.3 filed on Oct. 18, 2022, which are hereby incorporated herein by reference in their entireties.

TECHNICAL FIELD

The embodiments of the present disclosure relate to, but are not limited to the technical field of semiconductors, in particular to a transistor, a 3D memory and a manufacturing method therefor, and an electronic device.

BACKGROUND

In recent years, more and more attention has been paid to the memory with a 3D structure, which has certain advantages in improving the density of memory. In the field of memory, in order to improve the density of memory cells, the metal oxide semiconductor transistor can be used for a 3D stacked structure of memory cells.

At present, more and more attention is paid to the 3D device design structure for convenience of industry manufacturing and an advantage of storage density, etc.

SUMMARY

The following is a summary of the subject matter described in detail herein. This summary is not intended to limit the protection scope of the claims.

Embodiments of the present disclosure provide a 3D memory including: a plurality of layers of memory cells stacked in a direction perpendicular to a substrate and a word line, wherein the word line extends in a direction perpendicular to the substrate and penetrate through the memory cells of different layers.

The memory cell includes a transistor including a source, a drain, a gate extending in a direction perpendicular to the substrate, and a semiconductor layer located on a sidewall of the gate and insulated from the gate, wherein the semiconductor layer includes a source contact region and a drain contact region arranged at intervals, and a channel between the source contact region and the drain contact region is a horizontal channel.

In an exemplary embodiment, the semiconductor layer surrounds the sidewall of the gate.

In an exemplary embodiment, sources of transistors of different layers are arranged at intervals, and drains of transistors of different layers are arranged at intervals.

In an exemplary embodiment, gates of transistors of different layers are part of the word line, and semiconductor layers corresponding to transistors of different layers are located on the sidewall of the word line.

In an exemplary embodiment, the source of the same transistor is a source film layer, and the drain thereof is a drain film layer, and the drain film layer and the source film layer are located in the same layer and arranged at intervals.

In an exemplary embodiment, source films or drain films of different transistors are located in different film layers.

In an exemplary embodiment, orthographic projections of the source and the drain of the same transistor are not overlapped on a plane parallel to the substrate.

On a plane parallel to the substrate, orthographic projections of the sources and the drains of different transistors are not overlapped.

In an exemplary embodiment, the source is located at a first side of the gate, the drain is located at a second side of the gate, and the source and the drain are oppositely disposed.

In an exemplary embodiment, semiconductor layers of the transistors of the memory cells of different layers are arranged at intervals in a direction perpendicular to the substrate.

In an exemplary embodiment, an insulation layer is exposed between the semiconductor layers arranged at intervals, the insulation layer is a gate insulation layer between the gate and the semiconductor layer.

In an exemplary embodiment, every two adjacent semiconductor layers in the memory cells of different layers are connected as an integrated structure.

Embodiments of the present disclosure provide a vertical transistor for a 3D memory, including a substrate, and a source, a drain, a gate extending in a direction perpendicular to the substrate, and a semiconductor layer completely or partially surrounding the gate and insulated from the gate which are disposed on the substrate, wherein the semiconductor layer includes a source contact region and a drain contact region arranged at intervals, and a channel between the source contact region and the drain contact region is a horizontal channel.

In an exemplary embodiment, a film layer of the source and a film layer of the drain are different regions of a same conductive film layer and are arranged at intervals, the same conductive film layer is approximately parallel to the substrate.

In an exemplary embodiment, the material of the semiconductor layer includes a metal oxide semiconductor material.

In an exemplary embodiment, an orthographic projection of the source and an orthographic projection of the drain are not overlapped on a plane parallel to the substrate.

In an exemplary embodiment, the source contact region is located at a first side of the semiconductor layer, the drain contact region is located at a second side of the semiconductor layer, the source is in contact with the source contact region, the drain is in contact with the drain contact region, and the source and the drain are oppositely disposed.

In an exemplary embodiment, the semiconductor layer is an annular complete-surrounding semiconductor layer.

Embodiments of the present disclosure provide a manufacturing method for a 3D memory, wherein the 3D memory includes a plurality of layers of memory cells stacked along a direction perpendicular to a substrate, and a word line.

The memory cell includes a transistor including a source, a drain, a gate extending in a direction perpendicular to the substrate, and a semiconductor layer surrounding the gate; the manufacturing method for the 3D memory includes:

providing a substrate, depositing a plurality of insulation thin films and a plurality of conductive thin films alternately on the substrate in sequence, and patterning to form a plurality of stacked structures arranged at intervals in a direction parallel to the substrate, wherein each of the stacked structures includes a stack of insulation layers and conductive layers alternately arranged in the direction perpendicular to the substrate, each of the conductive layers corresponding to one transistor in one layer of the memory cell, and each of the conductive layers includes a first sub-portion and a second sub-portion that are connected with each other;

etching the stacked structures to form a through hole penetrating through the stacked structures in the direction perpendicular to the substrate, wherein a sidewall of the through hole exposes the first sub-portion and the second sub-portion of each of the conductive layers and the insulation layer; etching each of first sub-portions in the through hole to form a plurality of first channels corresponding to a plurality of transistors, and etching each of second sub-portions in the through hole to form a plurality of second channels corresponding to a plurality of transistors, wherein each of the first channels and each of the second channels are arranged at intervals and respectively communicated with the through hole;

depositing a metal thin film in a channel formed by each of the first channels, each of the second channels and the through hole, and etching to remove the metal thin film in the through hole to retain a metal thin film layer in each of the first channels and each of the second channels to form a plurality of sources located in a plurality of the first channels and a plurality of drains located in a plurality of the second channels;

filling with a semiconductor film on a sidewall of the through hole to form a semiconductor layer of each of the transistors, wherein the semiconductor layer is in contact with each of the sources and each of the drains, and a channel between the source and the drain in a same transistor is a horizontal channel;

depositing a gate insulation layer and a metal thin film in the through hole in sequence, wherein the metal thin film fills the through hole in the gate insulation layer to form the word line, and gates of transistors of different layers are part of the word line.

Embodiments of the present disclosure provide an electronic device including the 3D memory as described in any of the above embodiments, or including a vertical transistor for a 3D memory as described in any of the above embodiments.

Other features and advantages of the present disclosure will be set forth in the description which follows, and in part will be obvious from the description, or may be learned by practice of the present disclosure. The objects and advantages of the present disclosure can be realized and obtained by the structures particularly pointed out in the specification and drawings.

Other aspects will become apparent after reading and understanding the drawings and detailed description.

BRIEF DESCRIPTION OF THE DRAWINGS

The accompanying drawings are used for providing a further understanding of the technical solution of the present disclosure and constitute a part of the specification and serve to explain the technical solution together with the disclosed embodiments, but do not intend to limit the technical solution.

DETAILED DESCRIPTION

Figure 1:
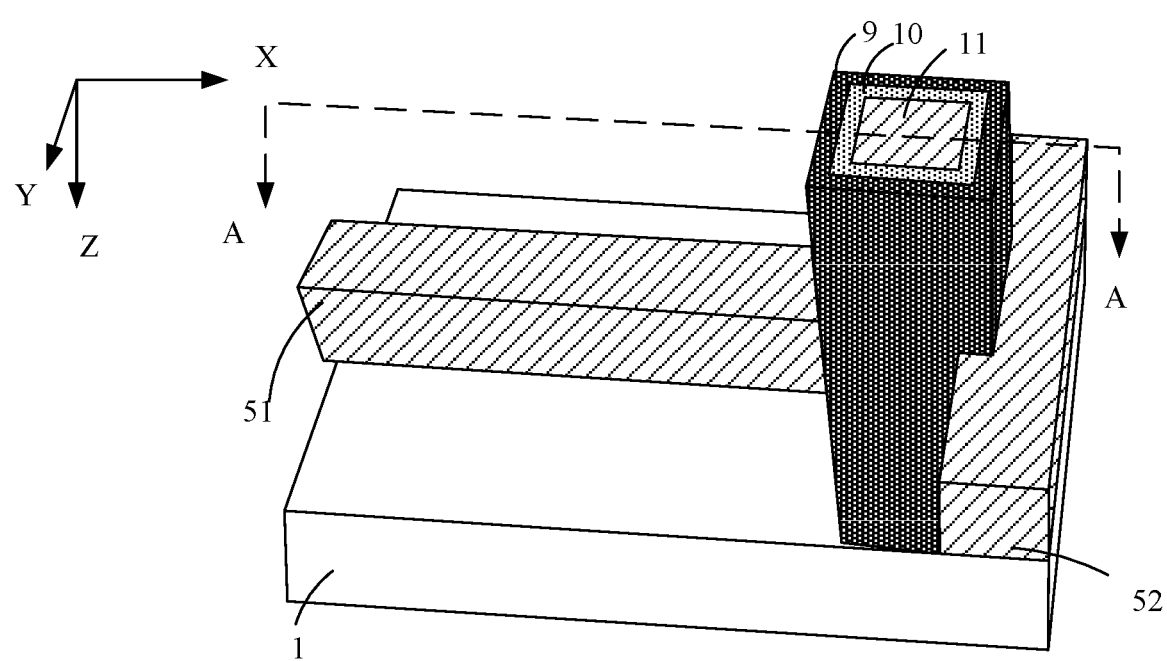
FIG. 1 is a schematic diagram of a transistor provided according to an exemplary embodiment.

Hereinafter, embodiments of the present disclosure will be described in detail with reference to the accompanying drawings. The embodiments in the present disclosure and the features in the embodiments may be combined with each other arbitrarily if there is no conflict.

Unless otherwise defined, technical terms or scientific terms used in the present disclosure shall have a general meaning as understood by a person of ordinary skill in the art to which the present disclosure pertains.

Embodiments of the present disclosure are not necessarily limited to this dimension, and the shape and size of each component in the drawings do not reflect true proportions. Further, the drawings schematically illustrate ideal examples, but embodiments of the present disclosure are not limited to shapes or values shown in the drawings.

Ordinal numerals such as "first", "second" and "third" in the present disclosure are provided to avoid confusion of constituent elements, but do not indicate any order, quantity or importance.

In the present disclosure, for convenience, words and expressions indicating orientation or positional relationship such as "middle", "upper", "lower", "front", "rear", "vertical", "horizontal", "top", "bottom", "inner" and "outer" are employed to explain the positional relationship of the constituent elements with reference to the accompanying drawings, they are employed for ease of description and simplification of the description only, but do not indicate or imply that the referred device or element must have a particular orientation, be constructed and operate in a particular orientation, and therefore cannot be construed as limiting to the present disclosure. The positional relationship of the constituent elements is appropriately changed according to the direction in which each constituent element is described. Therefore, it is not limited to the words and expressions described in the present disclosure, and can be appropriately replaced according to the situation.

In the present disclosure, the terms "mounted", "connected" and "connection" are to be understood broadly, unless otherwise expressly specified and defined. For example, it can be a fixed connection, a detachable connection, or an integrated connection; it can be a mechanical connection or an electrical connection; it can be direct connection, indirect connection through an intermedia, or internal communication between two elements. For those of ordinary skill in the art, the specific meaning of the above terms in the present disclosure may be understood according to actual situation.

In the present disclosure, functions of a "source" and a "drain" are sometimes interchanged when a transistor with an opposite polarity is used, or when a current direction changes during operation of a circuit. Therefore, in the present disclosure, the "source" and the "drain" can be interchanged with each other.

In the present disclosure, "electrical connection" includes the case where the constituent elements are connected together by elements having certain electrical effects. There are no special restrictions on "elements with certain electrical effects" as long as they can give and receive electrical signals between connected constituent elements. Examples of "elements having certain electrical effects" include not only electrodes and wiring, but also switching elements such as transistors, resistors, inductors, capacitors, and other elements having various functions, etc.

In the present disclosure, "parallel" refers to approximately parallel or almost parallel, for example, refers to a state in which the angle formed by two straight lines is more than −10 degrees and less than 10 degrees, and therefore also includes a state in which the angle is more than −5 degrees and less than 5 degrees. In addition, "perpendicular" refers to "approximately perpendicular", for example, refers to a state in which the angle formed by two straight lines is more than 80 degrees and less than 100, for example, and therefore also includes a state in which the angle is more than 85 degrees and less than 95 degrees.

The application will be described below in a sequence of a transistor and a 3D memory.

Figure 2:
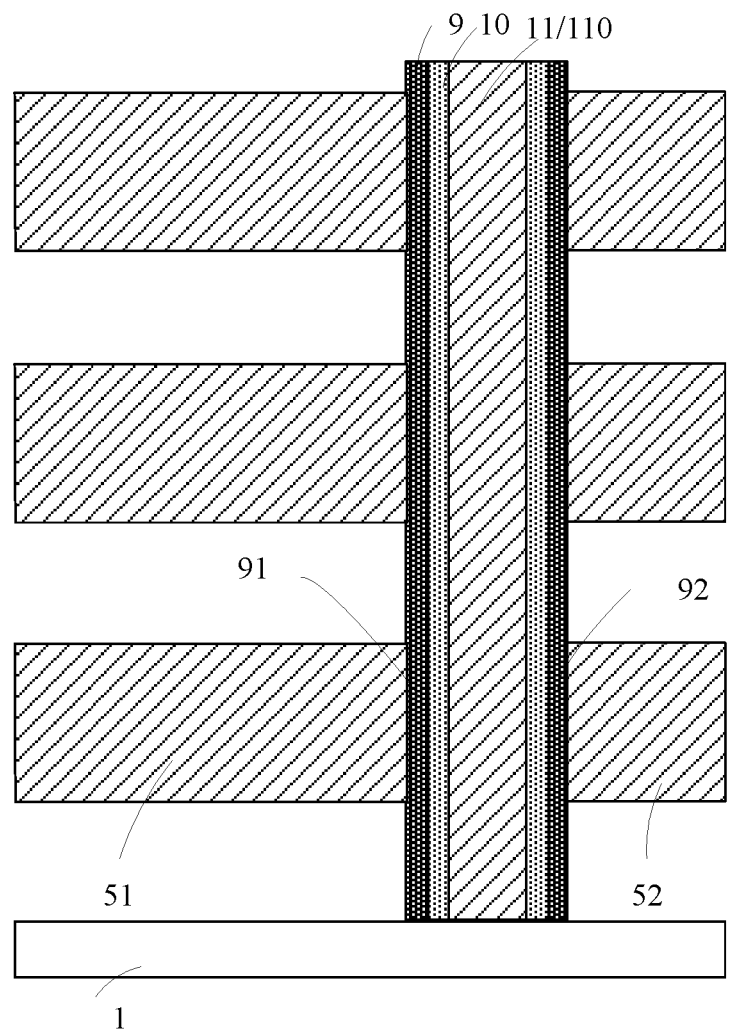
FIG. 2 is a cross section diagram of the transistor shown in FIG. 1 taken along a direction AA.

FIG. 1 is a schematic diagram of a transistor in a memory cell array provided according to an exemplary embodiment. FIG. 2 is a cross section diagram of the transistor shown in FIG. 1 taken along a direction AA. As shown in FIGS. 1 and 2, the embodiment provides a transistor, which is over a substrate 1, and may include a source 51, a drain 52, a gate 11 is a line, extending in a first direction Z, and a semiconductor layer 9 is a film, surrounding and insulated from the gate 11 which are disposed on the substrate, for example, the transistor may include a gate insulation layer 10 surrounding the gate 11, a semiconductor layer 9 surrounding the gate insulation layer 10.

The substrate is a supporting substrate of which the material and the internal structure are not the focus of the present application and therefore will not be specifically described herein.

The source 51, the drain 52 and the gate 11 extending in the first direction Z on the substrate 1 can be understood as the source 51, the drain 52 and the gate 11 extending in the first direction Z disposed above the substrate.

The gate 11 extending in the first direction Z can be understood as a gate extending in the direction perpendicular to the substrate and extending, as a whole, only in the direction perpendicular to the substrate, but the appearance of a side surface of the gate is not specifically limited. Exemplarily, the cross section shape and size of the gate may be similar, or the cross section shape and size may vary in different regions.

In some embodiments, the functions of the source 51 and the drain 52 are interchangeable, for example, the source 51 in FIG. 1 is a drain in other embodiments, and the drain 52 in FIG. 1 is a source in other embodiments.

The gate extends along the direction perpendicular to the substrate, wherein, the gate includes a side surface and end faces at upper end and lower end, the side surface, as a whole, is perpendicular to the substrate.

The semiconductor layer 9 surrounds and is insulated from the gate 11, wherein the semiconductor layer can be understood as a film layer having two opposite main surfaces and at least two end faces. The area of the two opposite main surfaces is larger than that of the end faces. For example, the semiconductor layer 9 extends along the sidewall of the gate, and a film thickness direction of the semiconductor layer 9 is approximately parallel to the substrate. The length of the film extending up and down along the sidewall of the gate is the height of the film, and the length of the film surrounding the gate is the width of the film.

Surrounding can be understood as partially or completely surrounding the gate. The gate is a line, and the channel is all around the gate. In some embodiments, the surrounding may be a complete surrounding, and a cross section of the surrounded semiconductor layer has an annular shape. The cross section is taken along a direction parallel to the substrate. In some embodiments the surrounding may be a partial surrounding, the cross-section of the surrounded semiconductor layer is not closed but appears an annular shape. For example, the cross section has an annular shape with an opening.

As shown in FIG. 2, the semiconductor layer 9 may include a source contact region 91 and a drain contact region 92 arranged at intervals, the source 51 is in contact with the source contact region 91, the drain 52 is in contact with the drain contact region 92, the source 51 and the drain 52 are insulated from the gate 11 by the gate insulation layer 10, and a channel between the source contact region 91 and the drain contact region 92 is a horizontal channel, i.e. a transport direction of carriers in the channel is parallel to an upper surface of the substrate 1 (i.e. a surface facing a side of the gate 11). Or, it can be understood that a length direction of the channel is parallel to the substrate 1. The direction of the channel is a transport direction of carriers, which is the length direction of the channel, and the direction perpendicular to the length direction is a width direction of the channel. The first direction Z may be perpendicular to the substrate 1.

The source contact region 91 and the drain contact region 92 being arranged at intervals means that they are not directly connected. In some embodiments, the source contact region 91 and the drain contact region 92 may be arranged at intervals in a direction parallel to the substrate 1, and center positions of the source contact region 91 and the drain contact region 92 may be in the same plane or offset by a certain distance from each other in a direction perpendicular to the substrate 1, but it is necessary to ensure that the direction of the channel is generally not perpendicular to the substrate, but tends to be horizontal.

In an exemplary embodiment, the semiconductor layer 9 is located only on the sidewall of the gate 11. Or, it can be understood that, a hole extending in the direction of the substrate is formed in the insulation layer, the semiconductor layer is located on the wall of the hole and extends in the direction perpendicular to the substrate to form a hole structure, and the gate is formed in the hole according to the shape of the hole and insulated from the gate by the gate insulation layer. The gate may be a solid structure or a hollow structure.

In an exemplary embodiment, the semiconductor layer 9 may extend on the sidewall of the gate 11 to form an annular semiconductor layer extending in a direction perpendicular to the substrate 1. In an exemplary embodiment, the semiconductor layer 9 surrounds the gate 11, but is not in contact with the gate 11, and the outer sidewall of the gate 11 is surrounded with the gate insulation layer 10, and the semiconductor layer 9 surrounds the gate insulation layer 10. The semiconductor layer 9 may be of a complete-surrounding type or a partial-surrounding type, for example, the semiconductor layer 9 may have gaps in the direction perpendicular to the substrate 1.

The source contact region 91 and the drain contact region 92 on the semiconductor layer 9 are determined according to the source and the drain, and the regions where the source 51 and the drain 52 are provided and are in contact with the semiconductor layer are the source contact region 91 and the drain contact region 92, respectively. The source contact region 91 and the drain contact region 92 are positioned so that the transport direction of carriers in the channel is not the vertical direction but the horizontal direction. For example, the channel direction between the source 51 and the drain 52 generally extends in a direction parallel to the substrate 1. In addition, when fabricating a 3D stacked memory cell, the gate 11 of each layer of transistor may be connected as a connected word line for each of the 3D stacked transistors. The word line extending in the vertical direction saves space and the gate and the word line of each transistor can be formed in one process, thus reducing the number of masks, effectively simplifying the process and reducing the cost.

Each source 51 is correspondingly provided with one independent source contact region and each drain 52 is correspondingly provided with one drain contact region.

The word line extending in the vertical direction may extend along a straight line direction or along a curve line direction. In some embodiments, the gate 11 of each transistor extending in the vertical direction may be a straight line, and orthographic projections of the gates 11 on the substrate 1 may be at the same position, then the gate of each transistor is connected to form a straight word line. The curve line may not be generally straight, but the gate in the corresponding semiconductor region or the effective semiconductor region is a straight line extending in the direction perpendicular to the substrate, and a portion of the word line between two adjacent layers may not be a straight line.

The cross section of the straight word line in the direction parallel to the substrate 1 may be the same everywhere or not completely the same. The cross section characteristics of the straight line in the embodiments of the present application are not limited.

In some embodiments, the gate 11 of each transistor extending in the vertical direction may be a straight line, and orthographic projections of the gates 11 on the substrate 1 may be located in positions that are not completely the same, thereby the gate 11 of each transistor is connected to form a whole extending in the direction perpendicular to the substrate 1 but partially curved.

The horizontal channel means that the transport direction of carriers in the channel is in a plane parallel to the substrate, but it is not limited that the transport direction of carriers must be one direction. In practical applications, the transport direction of carriers generally extends in one direction, but locally, the transport direction of carriers is related to the shape of the semiconductor layer. In other words, the horizontal channel does not mean that it must extend along a straight line in the horizontal plane, but it may extend along different directions. For example, when the semiconductor layer 9 is annular, the source contact region 91 and the drain contact region 92 on the annular semiconductor layer are part of the annulus. At this time, the carriers generally extend in one direction from the source contact region 91 to the drain contact region 92, but may not be in one direction locally. Obviously, that the transport direction of carriers is in a plane parallel to the substrate 1 is also a concept at the macro level, but is not limited to being absolutely parallel to the substrate. It is protected in the present application that the channel between the source 51 and the drain 52 is a channel not perpendicular to the substrate 1.

In the transistors provided according to some embodiments of the present disclosure, each of the transistors has a vertical gate and the channel is a horizontal channel, which facilitates the realization of a 3D stacked memory with simple structure and relatively easy fabrication. In an exemplary embodiment, on a plane parallel to the substrate 1, an orthographic projection of the source 51 and an orthographic projection of the drain 52 may not be overlapped, which ensures that the channel is a horizontal channel.

In an exemplary embodiment, orthographic projections of the source contact region 91 and the drain contact region 92 on a plane perpendicular to the substrate 1 may be overlapped, wherein the plane is located between the source contact region 91 and the drain contact region 92.

In an exemplary embodiment, the semiconductor layer 9 may be of a complete-surrounding type, i.e. complete-surrounding on the sidewall of the gate 11, that is, the cross section of the semiconductor layer 9 is closed-loop in a region corresponding to the gate 11. Exemplarily, the semiconductor layer 9 is annular, and in the cross section at each position of the gate 11, the semiconductor layer 9 is annular, and the annular shape is adapted to the outer profile of the cross section of the gate 11. Exemplarily, the cross section outer profile of the gate 11 may be circular, elliptical, square, or the like.

In an exemplary embodiment, in a direction perpendicular to the substrate 1, a first distance between a surface of a side of the source 51 close to the substrate 1 and the substrate 1 and a second distance between a surface of a side of the drain 52 close to the substrate 1 and the substrate 1 may be the same. That is, the distance between the source 51 and the substrate 1 and the distance between the drain 52 and the substrate 1 are the same. However, an embodiment of the present disclosure is not limited thereto, and the first distance and the second distance may be different. It can be understood that the source 51 and the drain 52 are located in different regions of the same metal thin film layer and arranged at intervals, and are formed by patterning a metal thin film layer which is approximately parallel to the upper surface of the substrate 1. The source 51 and the drain 52 have two main surfaces (upper and lower surfaces) and a side surface, respectively, the side surfaces are in contact with the semiconductor layer 9, and the shape of the side surface is adapted to the shape of the sidewall of the semiconductor layer 9.

In an exemplary embodiment, in a direction perpendicular to the substrate 1, a first thickness of the source 51 and a second thickness of the drain 52 may be the same. However, embodiments of the present disclosure are not limited thereto, and the first thickness and the second thickness may be different.

In an exemplary embodiment, the source 51 and the drain 52 may be located in the same conductive film layer along a direction perpendicular to the substrate 1. It can be understood that the source 51 and the drain 52 are located in the same metal thin film layer and are formed by patterning a metal thin film layer which is approximately parallel to the upper surface of the substrate 1.

In an exemplary embodiment, on a plane parallel to the substrate 1, an orthographic projection of the gate 11 may be located outside an orthographic projection of the source 51, and an orthographic projection of the gate 11 may be located outside an orthographic projection of the drain 52. According to the solution provided according to the embodiment, a plurality of transistors with simple structure and relatively easy fabrication can be realized, and the gate 11 of each transistor is connected to form a word line.

In an exemplary embodiment, the semiconductor layer 9 may be a metal oxide semiconductor layer or a semiconductor layer containing silicon.

In an exemplary embodiment, the metal in the metal oxide semiconductor layer may include at least one of indium, tin, zinc, aluminum, gallium, but is not limited to the material embodiments listed above.

In an exemplary embodiment, the metal oxide semiconductor layer may include at least one of indium oxide, tin oxide, indium-zinc (In—Zn) oxide, tin-zinc (Sn—Zn) oxide, aluminum-zinc (Al—Zn) oxide, indium-gallium (In—Ga) oxide, indium-gallium-zinc (In—Ga—Zn) oxide, indium-aluminum-zinc (In—Al—Zn) oxide, indium-tin-zinc (In—Sn—Zn) oxide, tin-gallium-zinc (Sn—Ga—Zn) oxide, aluminum-gallium-zinc (Al—Ga—Zn) oxide, tin-aluminum-zinc (Sn—Al—Zn) oxide.

In an exemplary embodiment, as shown in FIG. 2, the cross section of the gate 11 may be rectangular and the side surface has four side faces, each two of the side faces are opposite to each other (e.g. the first side and the second side are opposite to each other). The source 51 may be located at a first side of the gate 11, the drain 52 may be located at a second side of the gate 11, and the source 51 and the drain 52 may be oppositely disposed. That is, the first side and the second side are opposite sides. However, an embodiment of the present disclosure is not limited thereto, and the source 51 and the drain 52 may be in other positions.

In an exemplary embodiment, when the transistor is placed in an array, the source 51 may extend in a second direction X and the drain 52 may extend in a third direction Y, the second direction X may be parallel to the substrate 1 and the third direction Y may be parallel to the substrate 1. However, an embodiment of the present disclosure is not limited thereto, and the source 51 and the drain 52 may be of other shapes. It can be understood that the source 51 is integrally provided with the lead wire, the drain 52 is integrally provided with the lead wire, it is difficult to identify the boundary between the source 51 and the respective lead wire and the boundary between the drain 52 and the respective lead wire at this time, but it can be understood that the lead wire integrally provided with the source 51 extends along a row direction in the horizontal plane and the lead wire integrally provided with the drain 52 extends in the column direction.

In an exemplary embodiment, the second direction X and the third direction Y may intersect with each other.

In an exemplary embodiment, the second direction X and the third direction Y may be perpendicular to each other, but an embodiment of the present disclosure is not limited thereto, and other angles may be formed between the second direction X and the third direction Y.

In an exemplary embodiment, in the direction perpendicular to the substrate 1, the cross section of the source 51 may be square, circular, elliptical and the like, and the cross section of the drain 52 may be square, circular, elliptical and the like, an embodiment of the present disclosure is not limited thereto, and the cross sections of the source 51 and the drain 52 may be of other shapes, for example, circular, hexagonal, and the like.

In an exemplary embodiment, the source 51 and the drain 52 may be connected at other positions different from those shown in FIG. 1, for example, the source 51 is connected at a first side of the annular cylinder formed by the semiconductor layer 9, the drain 52 is connected at a second side of the annular cylinder formed by the semiconductor layer 9, and the first side and the second side are adjacent, and so on.

In an exemplary embodiment, the source 51 and the drain 52 may be disposed in the same layer. That is, the source 51 and the drain 52 may be simultaneously formed by the same one patterning process, but an embodiment of the present disclosure is not limited thereto, and the source 51 and the drain 52 may be respectively manufactured by different patterning processes.

The source 51 and the drain 52 described in an embodiment of the present application only refer to a first electrode and a second electrode except the gate of a transistor, and one of the first electrode and the second electrode is a source and the other is a drain. The identification of a source or drain in the product is determined according to the current flow direction, for example, the source described in an embodiment of the present application may be interpreted as a drain according to the current flow direction.

As shown in FIG. 2, the embodiment provides a solution in which the size of the channel between the source 51 and the drain 52 can be controlled by an overlapped length between the orthographic projection of the source 51 and the orthographic projection of the drain 52 on the plane perpendicular to the substrate 1. In FIG. 1B, the overlapped length between the orthographic projection of the source 51 and the orthographic projection of the drain 52 is d, the channel size can be controlled by controlling thicknesses of the source 51 and the drain 52 in a direction perpendicular to the substrate 1. Compared with a transistor in which a source surrounds the gate and a drain surrounds the gate and the channel size is controlled through changing the size of the through hole where the gate is located (which needs to change the process) or increasing the distance between the source and the drain (which will lead to the increase of the volume of the transistor), in the embodiment, the channel size can be controlled more conveniently, with little change in process and little influence on the size of the transistor.

The transistor structure shown in FIGS. 1 and 2 is a simplified schematic diagram. In the transistor actually manufactured, other film layers may be included, such as an insulation layer between the substrate 1 and the source 51 and the drain 52, and an insulation layer covering the source 51 and the drain 52, etc.

The technical solution of an embodiment is described below by the manufacturing process of the transistor of the embodiment. The "patterning process" in the embodiment includes film deposition, photoresist coating, mask exposure, development, etching, photoresist stripping and other treatments, which are mature manufacturing processes in related art. The "photolithography process" in the embodiment includes film layer coating, mask exposure and development, and are mature manufacturing processes in related art. The deposition may adopt known processes such as sputtering, evaporation, chemical vapor deposition, atomic layer deposition, and the coating may adopt known coating processes, and the etching may adopt known methods, which are not limited herein. In the description of the embodiment, "thin film" means a thin film made of certain material on a substrate by a deposition or coating process. If the "thin film" does not require a patterning process or photolithography process during the whole manufacturing process, the "thin film" can also be called a "layer". If the "thin film" needs a patterning process or photolithography process during the whole manufacturing process, it is called a "thin film" before the patterning process and a "layer" after the patterning process. The "layer" after the patterning process or photolithography process contains at least one "pattern".

The above-mentioned transistor 3D stack has a plurality of manufacturing methods, and the present application illustrates an implementation solution for understanding the above-mentioned structure, but not for limiting the above-mentioned structure, from the perspective of understanding the structure of the above-mentioned structure.

In an exemplary embodiment, the manufacturing process of the transistor may include following acts.

Figure 3:
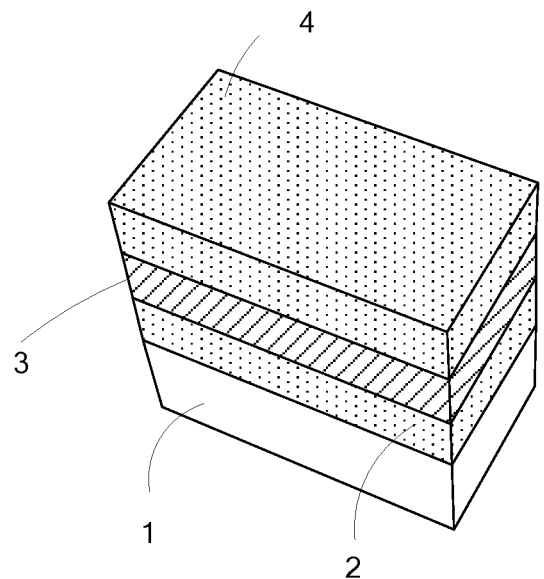
FIG. 3 is a schematic diagram after formation of a second insulation thin film provided according to an exemplary embodiment.

1) A first insulation thin film, a first metal thin film and a second insulation thin film are sequentially deposited on the substrate 1 to form a first insulation layer 2, a first metal layer 3 and a second insulation layer 4, respectively, as shown in FIG. 3.

In an exemplary embodiment, the substrate 1 may be manufactured using glass, silicon, flexible materials, or the like. The flexible material may be a material such as polyimide (PI), polyethylene terephthalate (PET), or a surface-treated polymer soft film. In an exemplary embodiment, the substrate 1 may be a single-layer structure or a multi-layer stacked structure, and the substrate of the stacked structure may include a flexible material/inorganic material/flexible material, the inorganic material may be, for example, any one or more of silicon nitride (SiNx), silicon oxide (SiOx) and silicon oxynitride (SiON).

In an exemplary embodiment, the first insulation thin film and the second insulation thin film may be low-K dielectric layers, i.e. dielectric layers having a dielectric constant K<3.9. For example, it may be any one or more of silicon nitride (SiNx), silicon oxide (SiOx), silicon oxynitride (SiON), and silicon carbide (SiC). The first insulation thin film and the second insulation thin film may be made of the same material or different materials.

In an exemplary embodiment, the first metal thin film may include, but is not limited to, at least one of: tungsten (W), aluminum (Al), molybdenum (Mo), ruthenium (Ru), titanium nitride (TiN), and tantalum (Ta).

Figure 4:
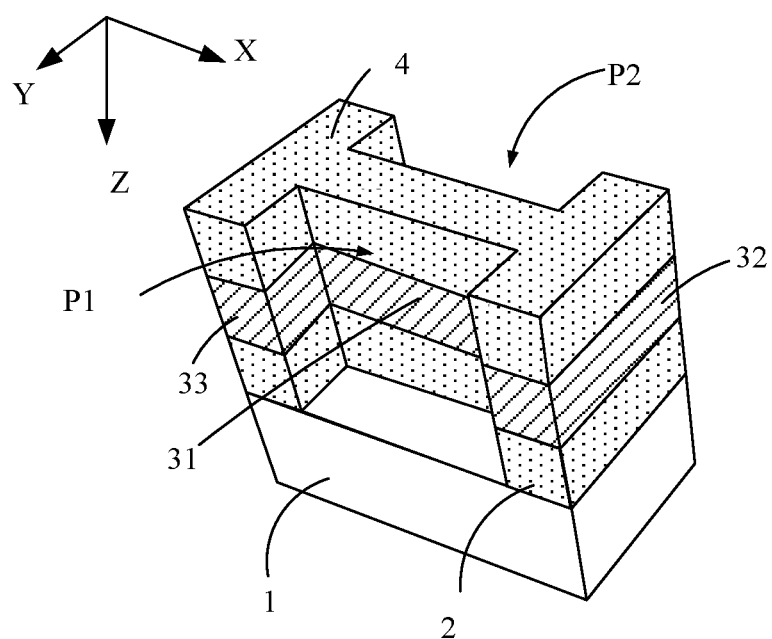
FIG. 4 is a schematic diagram after formation of an opening slot provided according to an exemplary embodiment.

2) The first insulation layer 2, the first metal layer 3 and the second insulation layer 4 are patterned by a patterning process to form a first opening slot P1 and a second opening slot P2, as shown in FIG. 4. The first opening slot P1 penetrates through the first insulation layer 2, the first metal layer 3 and the second insulation layer 4, and the second opening slot P2 penetrates through the first insulation layer 2, the first metal layer 3 and the second insulation layer 4. The first metal layer 3 may include a first sub-portion 31 extending in the second direction X and a second sub-portion 32 extending in the third direction Y.

In an exemplary embodiment, on a plane parallel to the substrate 1, the cross sections of the first insulation layer 2, the first metal layer 3, and the second insulation layer 4 may be H-shaped. At this time, the first metal layer 3 may include a second sub-portion 32 and a third sub-portion 33 which are opposite to each other, and a first sub-portion 31 connecting the second sub-portion 32 and the third sub-portion 33.

In an exemplary embodiment, the sizes and shapes of the first opening slot P1 and the second opening slot P2 may be the same, but an embodiment of the present disclosure is not limited thereto, and the sizes and shapes of the first opening slot P1 and the second opening slot P2 may be different.

In an exemplary embodiment, the third sub-portion 33 may extend in the third direction Y. However, an embodiment of the present disclosure is not limited thereto, and the third sub-portion 33 may be of other shapes. In an exemplary embodiment, the third sub-portion 33 may be removed.

In the embodiment, the pattern of the first metal layer 3 is only an example, and the first metal layer 3 may be of a pattern with another shape. For example, the current second sub-portion 32 is divided into two parts along the extending direction of the first sub-portion 31, and only one part may be retained as the second sub-portion 32.

Figure 5:
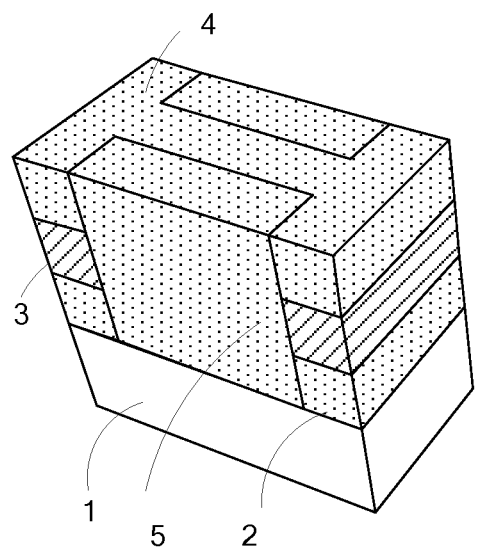
FIG. 5 is a schematic diagram after filling of the opening slot provided according to an exemplary embodiment.

3) A third insulation thin film is deposited on the substrate 1 on which the aforementioned patterns are formed to form a third insulation layer 5, wherein the third insulation layer fills the first opening slot P1 and the second opening slot P2, as shown in FIG. 5.

In an exemplary embodiment, the third insulation thin film may be a low-K dielectric layer, i.e. a dielectric layer with a dielectric constant K<3.9, for example, it may be any one or more of silicon nitride (SiNx), silicon oxide (SiOx), silicon oxynitride (SiON), silicon carbide (SiC). The third insulation thin film, the first insulation thin film and the second insulation thin film may be made of the same material or different materials.

Figure 6:
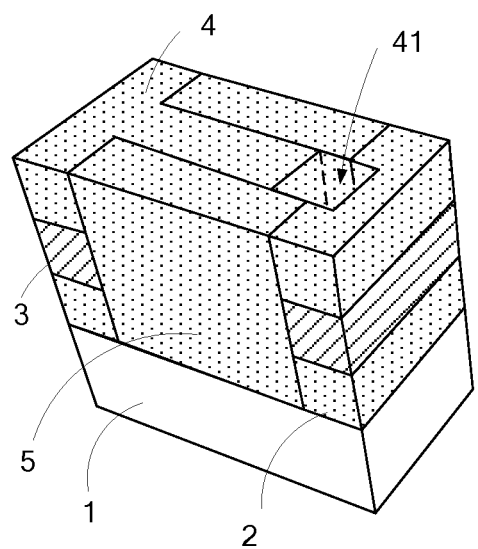
FIG. 6 is a schematic diagram after formation of a through hole provided according to an exemplary embodiment.

4) A through hole 41 penetrating through the first insulation layer 2, the first metal layer 3, and the second insulation layer 4 is formed on the substrate 1 on which the aforementioned patterns are formed, wherein an orthographic projection of the through hole 41 may be overlapped with an orthographic projection of the first sub-portion 31 and an orthographic projection of the second sub-portion 32 on a plane parallel to the substrate 1, as shown in FIG. 6. The cross section of the through hole 41 shown in FIG. 6 in a plane parallel to the substrate 1 is quadrilateral, but an embodiment of the present disclosure is not limited thereto, and the cross section of the through hole 41 in a plane parallel to the substrate 1 may be of other shapes, such as circular, pentagonal, hexagonal, and the like.

Figure 7A:
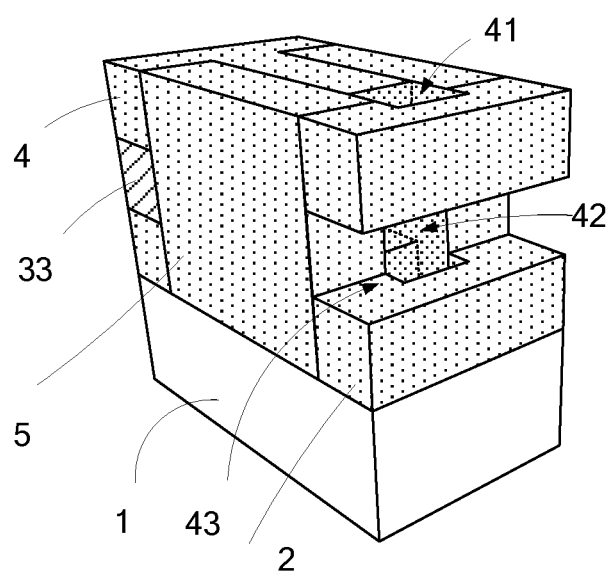
FIG. 7A is a schematic diagram after formation of a channel provided according to an exemplary embodiment.
Figure 7B:
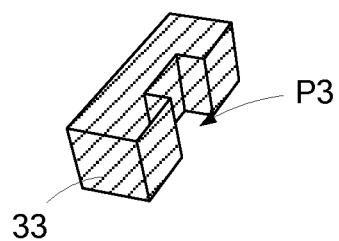
FIG. 7B is a schematic diagram of a first metal layer provided according to an exemplary embodiment.

5) On the substrate 1 on which the aforementioned patterns are formed, the first sub-portion 31, the second sub-portion 32 and a junction of the third sub-portion 33 and the first sub-portion 31 in the first metal layer 3 are selectively etched away to leave only the third sub-portion 33 in the first metal layer 3 at this time, and the third sub-portion 33 is provided with a third opening slot P3 facing the first sub-portion 31 (the first sub-portion 31 has been etched away), as shown in FIGS. 7A and 7B, at this time, a first channel 42 formed in a region in which the first sub-portion 31 has been selectively etched away, a second channel 43 formed in a region where the second sub-portion 32 is located and the through hole 41 are formed, wherein the first channel 42 is communicated with the through hole 41, and the second channel 43 is communicated with the through hole 41.

Figure 8A:
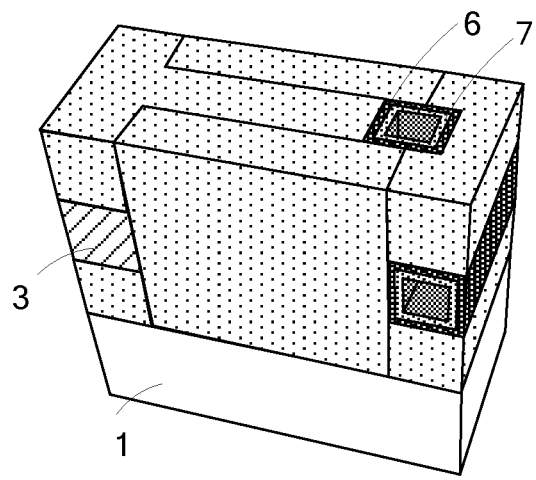
FIG. 8A is a schematic diagram after formation of an active layer and a first gate insulation layer provided according to an exemplary embodiment.
Figure 8B:
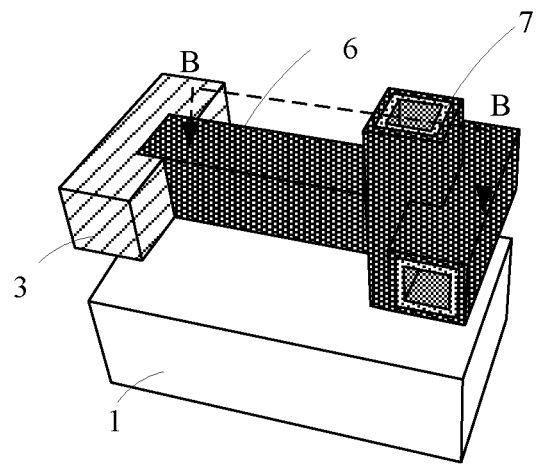
FIG. 8B is a partial schematic diagram of FIG. 8A.
Figure 8C:
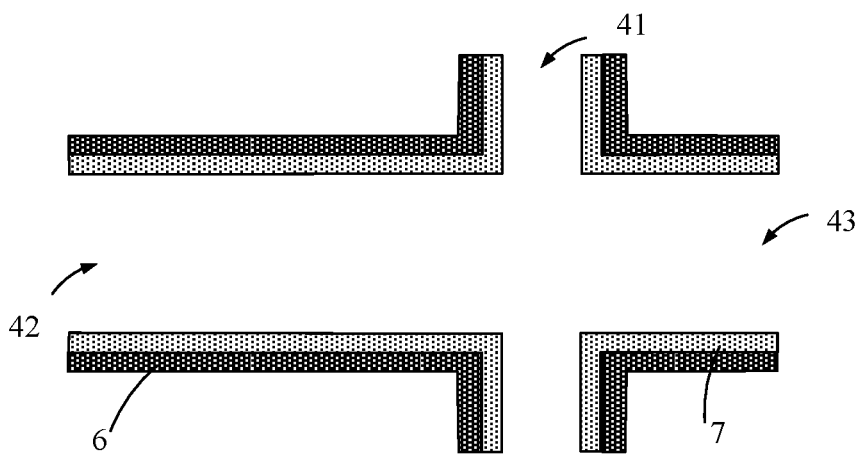
FIG. 8C is a schematic cross section diagram of FIG. 8B taken along a direction BB.

6) A first semiconductor thin film and a first gate oxide thin film thin are sequentially deposited on a sidewall of the channel formed in act 5 (i.e., the through hole 41, the first channel 42 and the second channel 43) to form an active layer 6 and a first gate insulation layer 7, respectively, as shown in FIGS. 8A, 8B and 8C, wherein FIG. 8C is a cross section diagram of FIG. 8B taken along a direction BB and only shows the active layer 6 and the first gate insulation layer 7. The active layer 6 and the first gate insulation layer 7 act as the channel wall of the channel, and the active layer 6 surrounds the first gate insulation layer 7.

In an exemplary embodiment, the first gate oxide thin film may be a High-K dielectric material. The High-K dielectric material may include, but is not limited to, at least one of the following: silicon oxide, aluminum oxide, hafnium oxide.

In an exemplary embodiment, the first semiconductor thin film, as a channel layer, may be a film layer containing silicon, or a metal oxide semiconductor, wherein the metal oxide semiconductor includes, but is not limited to, at least one of the following materials: IGZO, Indium Tin Oxide (ITO), Indium Zinc Oxide (IZO). When IGZO is used as semiconductor layer, it has the advantages of low electric leakage and short refresh time. A subsequent second semiconductor thin film is similar and will not be repeated here.

In an exemplary embodiment, the first semiconductor thin film and the first gate oxide thin film may be deposited through an Atomic Layer Deposition (ALD) approach.

Figure 9A:
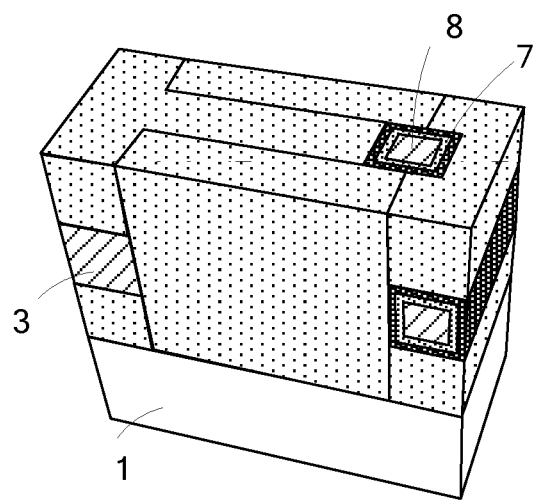
FIG. 9A is a schematic diagram after formation of a second metal layer provided according to an exemplary embodiment.
Figure 9B:
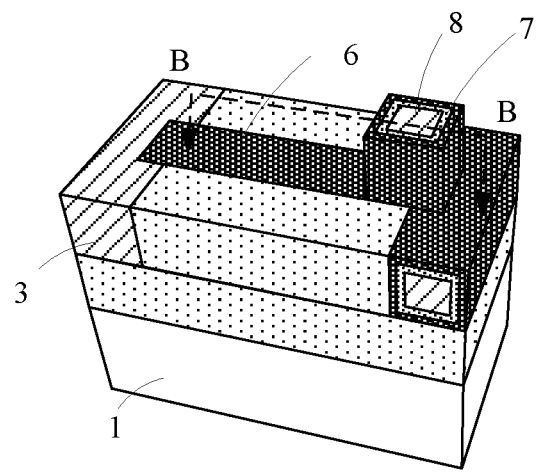
FIG. 9B is a partial schematic diagram of FIG. 9A.
Figure 9C:
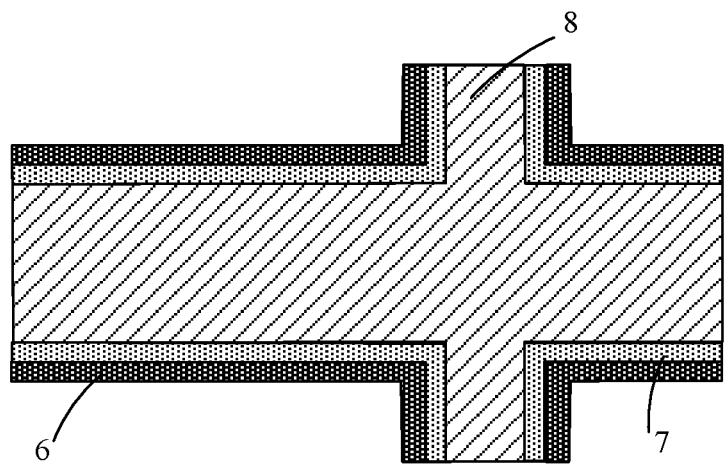
FIG. 9C is a schematic cross section diagram of FIG. 9B taken along a direction BB.

7) A second metal thin film is deposited within the channel (i.e. the through hole 41, the first channel 42 and the second channel 43) to form a second metal layer 8 which completely fills the channel, as shown in FIGS. 9A, 9B and 9C. FIG. 9C is a cross section diagram of FIG. 9B taken along a direction BB and shows only the active layer 6, the first gate insulation layer 7 and the second metal layer 8. At this time, the first gate insulation layer 7 surrounds the second metal layer 8.

In an exemplary embodiment, the second metal thin film may include, but is not limited to, at least one of: tungsten (W), aluminum (Al), molybdenum (Mo), ruthenium (Ru), titanium nitride (TiN), and tantalum (Ta). The second metal thin film may be the same as or different from the first metal thin film.

Figure 10A:
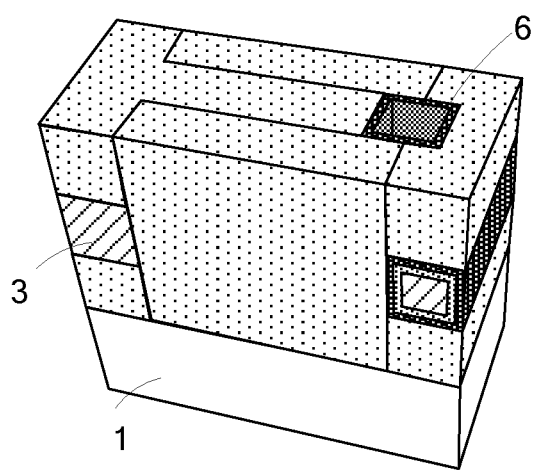
FIG. 10A is a schematic diagram after removal of a second metal layer in a through hole provided according to an exemplary embodiment
Figure 10B:
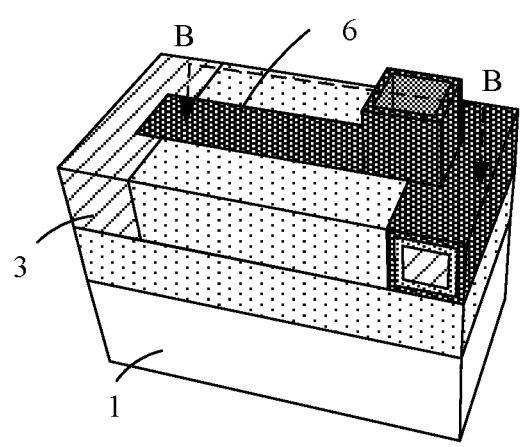
FIG. 10B is a partial schematic diagram of FIG. 10A.
Figure 10C:
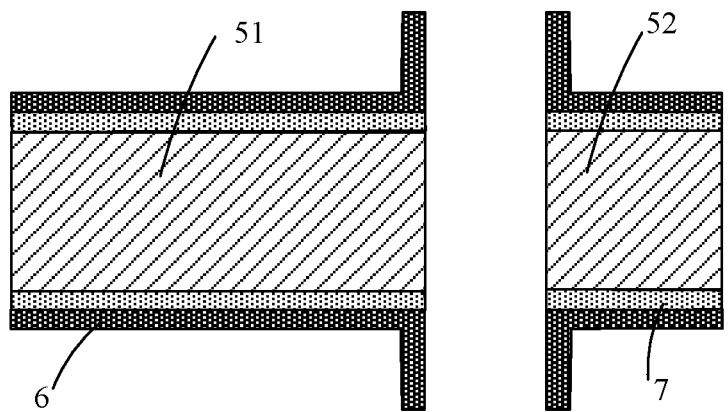
FIG. 10C is a schematic cross section diagram of FIG. 10B taken along a direction BB.

8) The second metal layer 8 and the first gate insulation layer 7 in the position where the through hole 41 is located are selectively photoetched and etched to retain the second metal layer 8 (the second metal layer 8 in the first channel 42 and the second channel 43 parallel to the substrate 1) at other positions in the channel, as shown in FIGS. 10A, 10B and 10C, wherein FIG. 10C is a cross section diagram of FIG. 10B taken along a direction BB and shows only the active layer 6, the first gate insulation layer 7 and the second metal layer 8. The second metal layer 8 located in the first channel 42 acts as the source 51 of the transistor, and the second metal layer 8 located in the second channel 43 acts as the drain 52 of the transistor, and the source 51 and the drain 52 are disconnected from each other.

Figure 11A:
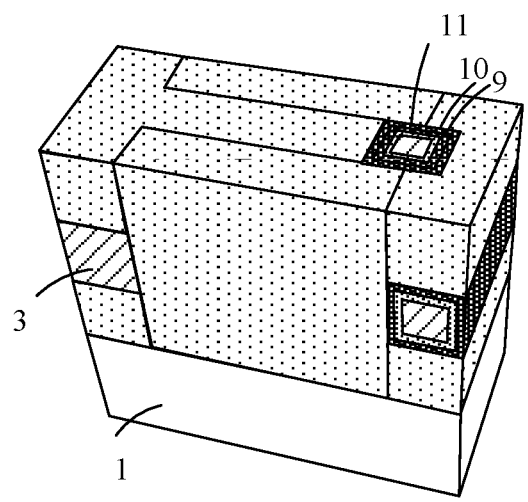
FIG. 11A is a schematic diagram after formation of a gate provided according to an exemplary embodiment.
Figure 11B:
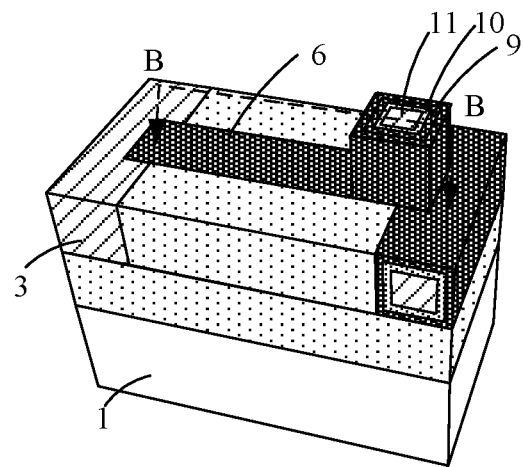
FIG. 11B is a partial schematic diagram of FIG. 11A.
Figure 11C:
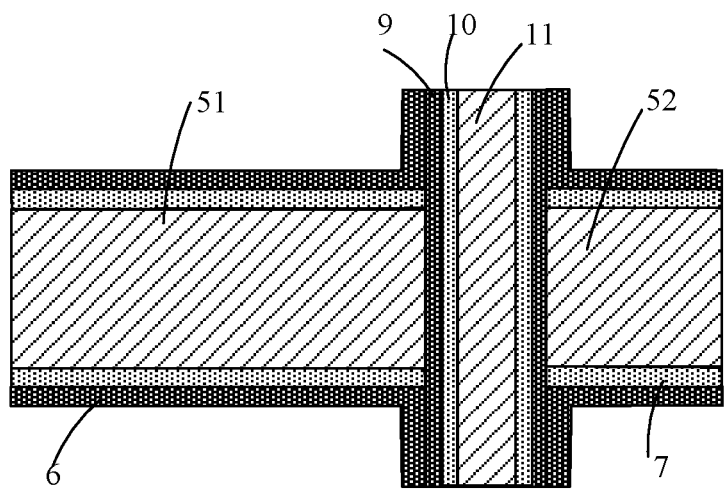
FIG. 11C is a schematic cross section diagram of FIG. 11B taken along a direction BB.

9) A second semiconductor thin film, a second gate oxide thin film and a third metal thin film are sequentially deposited on the sidewall of the through hole obtained by etching to form a semiconductor layer 9, a gate insulation layer 10 and a gate 11, respectively, and the gate insulation layer 10 surrounds the gate 11, the semiconductor layer 9 surrounds the gate insulation layer 10, and the gate 11 completely fills a region surrounded by the gate insulation layer 10. As shown in FIGS. 11A, 11B, and 11C, FIG. 11C is a cross sectional diagram of FIG. 11B taken along a direction BB, and shows only the active layer 6, the first gate insulation layer 7, the semiconductor layer 9, the gate insulation layer 10, the second metal layer 8 (source 51, drain 52), and the gate 11.

In an exemplary embodiment, the second gate oxide thin film may be a High-K dielectric material. The High-K dielectric material may include, but is not limited to, at least one of the following: silicon oxide, aluminum oxide, hafnium oxide.

In an exemplary embodiment, the third metal thin film may include, but is not limited to, at least one of: tungsten (W), aluminum (Al), molybdenum (Mo), ruthenium (Ru), titanium nitride (TiN), and tantalum (Ta). The third metal thin film may be the same as or different from the first metal thin film and the second metal thin film.

Figure 11D:
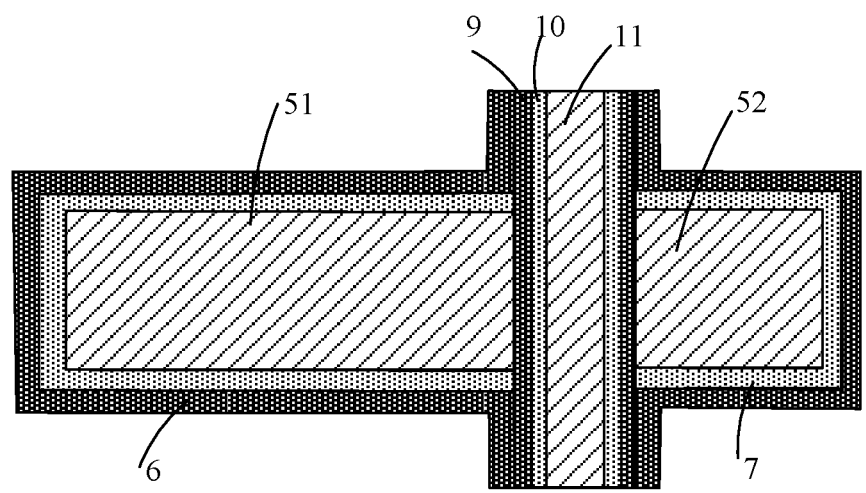
FIG. 11D is a schematic cross section diagram of a source, a drain and a gate provided according to an exemplary embodiment.

The transistor manufactured by the above manufacturing method may further include a first gate insulation layer 7 surrounding the source 51 and the drain 52, and an active layer 6 surrounding the first gate insulation layer 7 (sides of the source 51 and the drain 52 away from the gate 11 are sequentially covered with the first gate insulation layer 7 and the active layer 6, as shown in FIG. 11D). In another exemplary embodiment, the active layer 6 and the first gate insulation layer 7 may be etched away, which is not limited in the embodiments of the present disclosure.

The above manufacturing process is only an example, and the embodiments of the present disclosure are not limited thereto and may be manufactured by other means. For example, after the first metal thin film is deposited, the H-shaped first metal layer 3 may be formed by patterning through a patterning process. Subsequently, a second insulation thin film is deposited to form a second insulation layer 4, it is not needed to perform slotting to form a first opening slot P1 and a second opening slot P2, and it is not needed to deposit a third insulation thin film.

Embodiments of the present disclosure also provide an electronic device including the transistor described in any one of the foregoing embodiments. The electronic device can be a storage device, a smart phone, a computer, a tablet computer, an artificial intelligence device, a wearable device or a mobile power supply, etc. The storage device may include a memory in a computer or the like, which is not limited here.

In another exemplary embodiment, the manufacturing process of the transistor may include following acts.

Figure 12:
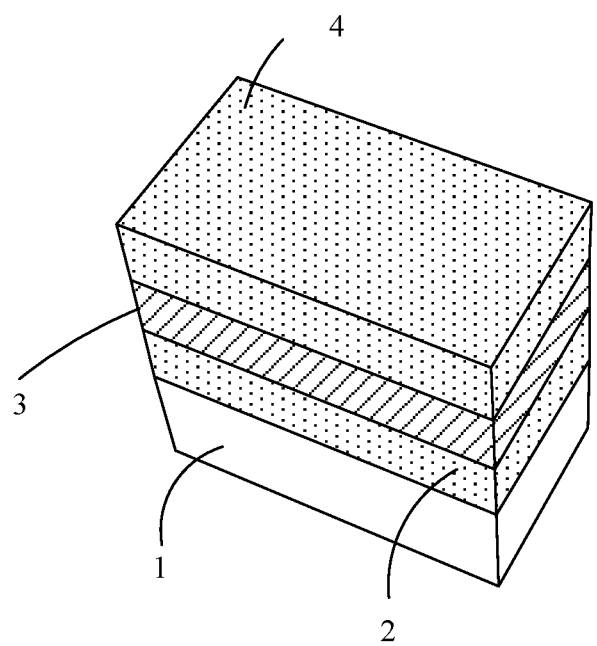
FIG. 12 is a schematic diagram after formation of a second insulation thin film provided according to an exemplary embodiment.

1) A first insulation thin film, a first metal thin film and a second insulation thin film are sequentially deposited on the substrate 1 to form a first insulation layer 2, a first metal layer 3 and a second insulation layer 4, respectively, as shown in FIG. 12.

Figure 13:
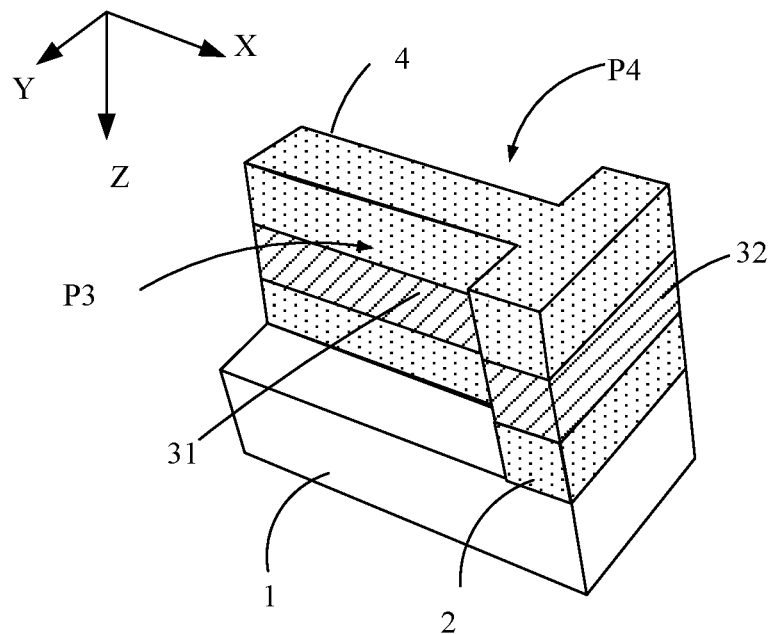
FIG. 13 is a schematic diagram after formation of an opening slot provided according to an exemplary embodiment.

2) The first insulation layer 2, the first metal layer 3 and the second insulation layer 4 are patterned by a patterning process to form a third opening slot P3 and a fourth opening slot P4, as shown in FIG. 13. The third opening slot P3 penetrates through the first insulation layer 2, the first metal layer 3 and the second insulation layer 4, and the fourth opening slot P4 penetrates through the first insulation layer 2, the first metal layer 3 and the second insulation layer 4. The first metal layer 3 may include a first sub-portion 31 extending in the second direction X and a second sub-portion 32 extending in the third direction Y.

In an exemplary embodiment, the sizes and shapes of the third opening slot P3 and the fourth opening slot P4 may be the same, but an embodiment of the present disclosure is not limited thereto, and the sizes and shapes of the third opening slot P3 and the fourth opening slot P4 may be different.

In the embodiment, the pattern of the first metal layer 3 is only an example, and the first metal layer 3 may be of a pattern with another shape. For example, the current second sub-portion 32 is divided into two parts along the extending direction of the first sub-portion 31, and only one part may be retained as the second sub-portion 32.

Figure 14:
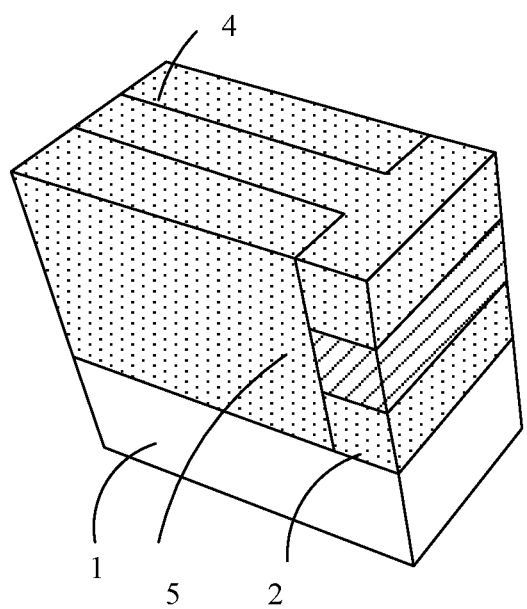
FIG. 14 is a schematic diagram after filling of the opening slot provided according to an exemplary embodiment.

3) A third insulation thin film is deposited on the substrate 1 on which the aforementioned patterns are formed to form a third insulation layer 5, wherein the third insulation layer fills the third opening slot P3 and the fourth opening slot P4, as shown in FIG. 14.

In an exemplary embodiment, the third insulation thin film may be a low-K dielectric layer, i.e. a dielectric layer with a dielectric constant K<3.9, for example, it may be any one or more of silicon nitride (SiNx), silicon oxide (SiOx), silicon oxynitride (SiON), silicon carbide (SiC). The third insulation thin film, the first insulation thin film and the second insulation thin film may be made of the same material or different materials.

Figure 15:
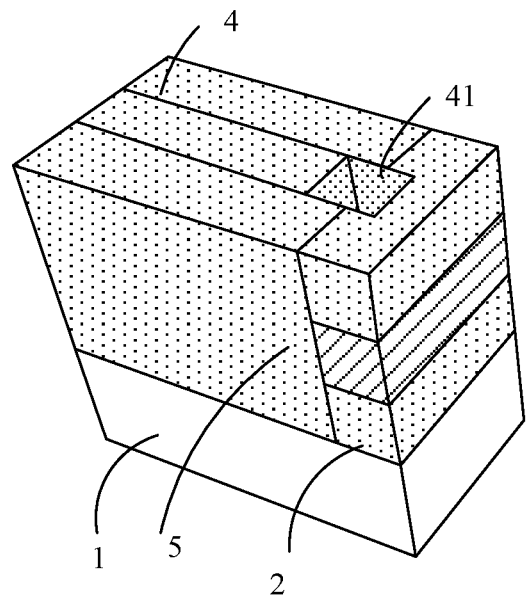
FIG. 15 is a schematic diagram after formation of a through hole provided according to an exemplary embodiment.

4) A through hole 41 penetrating through the first insulation layer 2, the first metal layer 3, and the second insulation layer 4 is formed by etching on the substrate 1 on which the aforementioned patterns are formed, wherein an orthographic projection of the through hole 41 may be overlapped with an orthographic projection of the first sub-portion 31 and an orthographic projection of the through hole 41 may be overlapped with an orthographic projection of the second sub-portion 32 on a plane parallel to the substrate 1, as shown in FIG. 15. After the first sub-portion 31 and the second sub-portion 32 are etched, one of them forms a drain and the other forms a source. The cross section of the through hole 41 shown in FIG. 15 in a plane parallel to the substrate 1 is quadrilateral, but an embodiment of the present disclosure is not limited thereto, and the cross section of the through hole 41 in a plane parallel to the substrate 1 may be of other shapes, such as circular, pentagonal, hexagonal, and the like.

Figure 16:
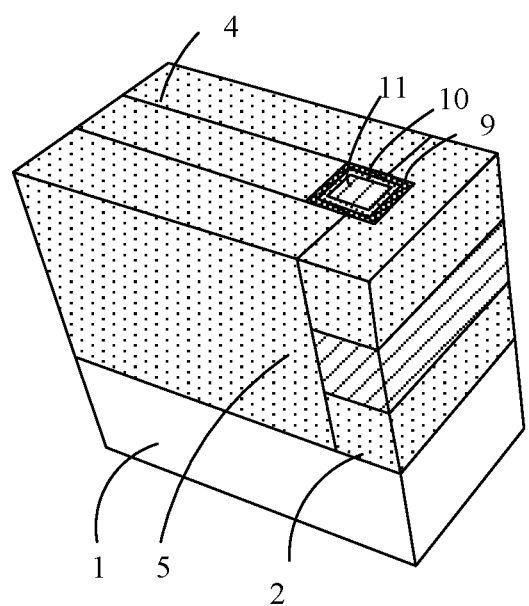
FIG. 16 is a schematic diagram after formation of a gate provided according to an exemplary embodiment.

5) A second semiconductor thin film, a second gate oxide thin film and a third metal thin film are sequentially deposited on the sidewall of the through hole 41 described above to form a semiconductor layer 9, a gate insulation layer 10 and a gate 11, respectively, and the gate insulation layer 10 surrounds the gate 11, the semiconductor layer 9 surrounds the gate insulation layer 10, and the gate 11 completely fills a region surrounded by the gate insulation layer 10. The semiconductor layer 9 is a semiconductor layer of a transistor, the gate insulation layer 10 is a gate insulation layer of a transistor, and the gate 11 is a gate of a transistor, as shown in FIG. 16.

In an exemplary embodiment, the second gate oxide thin film may be a High-K dielectric material. The High-K dielectric material may include, but is not limited to, at least one of the following: silicon oxide, aluminum oxide, hafnium oxide.

In an exemplary embodiment, the third metal thin film may include, but is not limited to, at least one of: tungsten (W), aluminum (Al), molybdenum (Mo), ruthenium (Ru), titanium nitride (TiN), and tantalum (Ta). The third metal thin film may be the same as or different from the first metal thin film.

When manufacturing the transistor described above, a plurality of transistors sharing the semiconductor layer 9, the gate insulation layer 10, and the gate 11 can be manufactured by alternately stacking the insulation thin films and the metal thin films.

The transistor described above can be used for 3D memory. If at least one transistor in the memory cells of different layers needs to be stacked when fabricating the 3D stacked memory cell, transistors described above provided in an embodiment of the present application can form a structure stacked in column in the vertical direction according to the transistor described above. The structure stacked in column may be a stack of transistors in a 1T1C memory cell, or may be a stack of transistors in one of a 2T0C or a 2T1C structure.

Taking a 1T1C memory cell as an example, only the stacking scheme of a column of different transistors in the longitudinal direction is introduced as follows. Embodiments of the present disclosure provide a 3D memory, which may include a plurality of layers of memory cells stacked in a direction perpendicular to a substrate, and a word line, wherein the word line extends in a direction perpendicular to the substrate and penetrates through the memory cells of different layers.

The memory cell may include a transistor, which may include a source, a drain, a gate extending in a direction perpendicular to the substrate, and a semiconductor layer surrounding the gate and insulated from the gate, wherein the semiconductor layer may include a source contact region and a drain contact region arranged at intervals, and a channel between the source contact region and the drain contact region is a horizontal channel.

In an exemplary embodiment, the sources of transistors of different layers may be arranged at intervals, and the drains of transistors of different layers may be arranged at intervals.

In an exemplary embodiment, the gates of transistors of different layers are part of the word line.

Figure 17A:
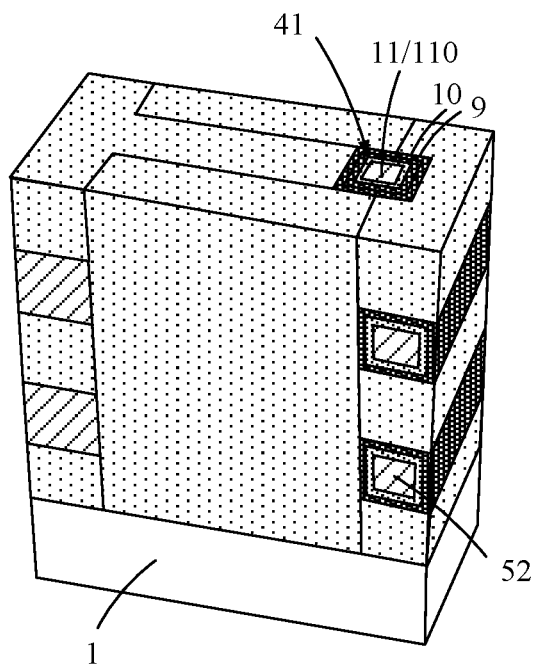
FIG. 17A is a schematic diagram of a semiconductor device provided according to an exemplary embodiment.
Figure 17B:
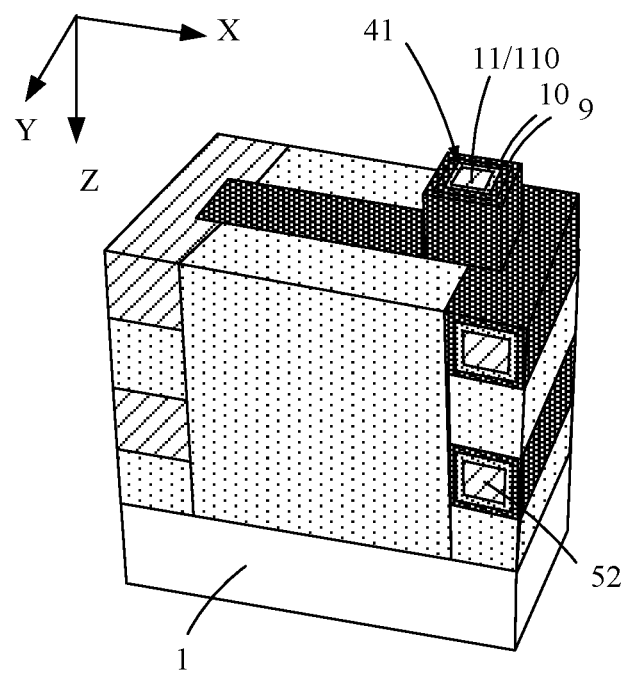
FIG. 17B is a partial schematic diagram of 17A.

As shown in FIGS. 2, 17A, and 17B, a stack of transistors in two-layer stacked memory cells is illustrated, embodiments of the present disclosure provide a 3D memory that may include: a plurality of layers of memory cells stacked in a direction perpendicular to a substrate 1 (only transistors are shown in the drawing, no capacitor is shown), a word line 110 (the word line 110 includes a gate 11).

The memory cell may include a transistor, the transistor may include a source 51 (FIGS. 17A and 17B show a three-dimensional structure rather than a cross section diagram, and the source 51 cannot be shown in the FIGS. 17A and 17B and is therefore not shown in the drawings, please refer to FIGS. 2, 11A to 11D in the embodiments of the transistor), a drain 52, a gate 11 extending in a direction perpendicular to the substrate 1, a semiconductor layer 9 located on a sidewall of the gate 11 and insulated from the gate 1, wherein the semiconductor layer 9 may include a source contact region and a drain contact region arranged at intervals, the source 51 is in contact with the source contact region, the drain 52 is in contact with the drain contact region, a channel between the source contact region and the drain contact region is a horizontal channel.

The word line 110 extends in a direction perpendicular to the substrate 1 and penetrates through the memory cells of different layers.

In an exemplary embodiment, the semiconductor layer 9 may surround the sidewall of the gate 11. In some embodiments, the sidewall of the gate extends only in a direction perpendicular to the substrate, the semiconductor layer generally extends only in a direction perpendicular to the substrate, and a case in which a curved region may exist locally during actual production of the product is also included in the case described above.

In an exemplary embodiment, the sources 51 of the transistors of different layers may be arranged at intervals, and the drains 52 of the transistors of different layers may be arranged at intervals. Being arranged at intervals may be understood as there is no direct connection relationship between each other and they are separated from each other in terms of position by an insulation layer, but does not mean that the sources or drains of different layers are coupled in other regions.

In an exemplary embodiment, the gates 11 of the transistors of different layers may be part of the word line 110, and the semiconductor layers 9 corresponding to the transistors of different layers are located on the sidewall of the word line 110. In terms of process, the design can form the word line and the gates of memory cells in different layers at one time, which significantly reduces the cost.

In an exemplary embodiment, the gates 11 of transistors of different layers are connected to form the word line 110. It can be understood that the word line extends only in the vertical direction without a branch structure extending on the sidewall.

In an exemplary embodiment, the word line 110 extending in a direction perpendicular to the substrate 1 may be a straight line.

In an exemplary embodiment, the different regions of the word line extending in a direction perpendicular to the substrate 1 have the same material composition. It can be understood that the different regions of the word line are formed by the same film fabrication process. Having the same composition of material can be understood that the main elements tested in the materials are the same. For example, the different regions of the word line are all made of transparent conductive materials such as metals or ITO, but the atomic number ratios of different regions thereof are not limited.

In an exemplary embodiment, the word line 110 extending in a direction perpendicular to the substrate 1 has approximately the same cross section shape, which can be understood as using a process to form a dug hole. The hole is a longitudinal hole, and the word line fills the hole formed with a channel and a gate insulation layer. Generally, the shape of the cross section of the hole is approximately same and the size thereof is approximately similar. For example, for the regions of the word line corresponding to different layers, cross sections are all annular, specifically square, elliptical, or other shapes, which are not limited in the present application.

In an exemplary embodiment, the semiconductor layers 9 corresponding to transistors of different layers are located on the sidewall of the word line 110 and are respectively located in different regions extending in a direction perpendicular to the substrate 1.

In an exemplary embodiment, the source 51 and the drain 52 of the same transistor may be located in the same conductive film layer, and the sources 51 or the drains 52 of different transistors may be located in different conductive film layers.

In an exemplary embodiment, the source of the same transistor is a source film layer, and the drain is a drain film layer, and the drain film layer and the source film layer are located in the same layer and arranged at intervals. In an actual process, the source and the drain of a transistor are formed by patterning a conductive film layer. Therefore, it can be understood as that the drain film layer and the source film layer are located in the same layer, and in an actual product, the cross sections are in one horizontal plane and the materials are the same.

In an exemplary embodiment, the source film layers or the drain film layers of different transistors are located in different film layers, embodying a 3D stacked structure of different transistors. Projections of the sources of different transistors of a 3D stacked structure are overlapped in a direction perpendicular to the substrate, projections of the drains of the different transistors in the direction perpendicular to the substrate are overlapped. In the process, the sources and the drains stacked in a plurality of layers can be formed through the relative stacking of the conductive layers and the insulation layers and then through a mask, the realizing process is simple.

In an exemplary embodiment, the conductive film layer may be parallel to the substrate 1.

In an exemplary embodiment, orthographic projections of the source contact region and the drain contact region on a plane perpendicular to the substrate 1 are overlapped.

In an exemplary embodiment, orthographic projections of the source 51 and the drain 52 of the same transistor on a plane parallel to the substrate 1 are not overlapped.

In an exemplary embodiment, orthographic projections of the sources 51 and the drains 52 of different transistors on a plane parallel to the substrate 1 are not overlapped.

In an exemplary embodiment, the source 51 may be located at a first side of the gate 11, the drain 52 may be located at a second side of the gate 11, and the source 51 and the drain 52 may be oppositely disposed.

In an exemplary embodiment, semiconductor layers 9 of the transistors of the memory cells of different layers may be arranged at intervals in a direction perpendicular to the substrate. According to the solution provided in the embodiment, electric leakage between transistors of different layers through the semiconductor layer 9 can be avoided, and power consumption can be reduced.

In an exemplary embodiment, there is an isolation layer between the semiconductor layers 9 arranged at intervals, and the isolation layer may be an insulation layer obtained by doping the semiconductor layers 9.

In an exemplary embodiment, the sidewall of the word line 110 is provided with a gate insulation layer 10 surrounding the word line 110, and the semiconductor layers 9 of the transistors of different layers may be continuously distributed on the sidewall of the word line 110.

In an exemplary embodiment, an insulation layer may be exposed between the semiconductor layers 9 arranged at intervals, and the insulation layer may be a gate insulation layer 10 between the gate 11 and the semiconductor layer 9.

In an exemplary embodiment, every two adjacent semiconductor layers 9 in the memory cells of different layers may be connected as an integrated structure.

In an exemplary embodiment, stacked transistors of different layers may share one word line 110 extending in a direction perpendicular to the substrate 1.

In an exemplary embodiment, transistors of different layers may share one annular gate insulation layer 10 extending in a direction perpendicular to the substrate 1. In the embodiment, the gate insulation layer 10 of a plurality of transistors can be formed by one manufacturing process, thus simplifying the process and reducing the cost.

In an exemplary embodiment, transistors of different layers may share an annular semiconductor layer 9 extending in a direction perpendicular to the substrate 1. In the embodiment, the semiconductor layer 9 of a plurality of transistors can be formed by one manufacturing process, thus simplifying the process and reducing the cost.

In an exemplary embodiment, the semiconductor layer 9 may be a metal oxide semiconductor layer or the semiconductor layer 9 may be a semiconductor layer containing silicon.

In an exemplary embodiment, projections of the sources 51 of different layers on the substrate 1 may be located in the same region, and projections of the drains 52 of different layers on the substrate 1 may be located in the same region. Projections of the gates 11 of different layers on the substrate 1 may be located in the same region. According to the solution provided according to the embodiment, the orthographic projections of the sources 51, the drains 52 and the gates 11 of different layers are located in the same region, so that the structure of the 3D memory can be compact, and the manufacturing process can be simplified without patterning the source 51 and the drain 52 of each layer respectively.

The structure of a single transistor in the above-mentioned 3D memory may refer to the structure of the transistor in the plurality of embodiments described above and will not be repeated here.

In the 3D memory provided according to the embodiment, the gate of the transistor is a vertical gate, and the channel is a horizontal channel, which is convenient for realizing a 3D stacked memory with simple structure and relatively easy fabrication and high 3D integration. In addition, the gate of each stacked transistor can be shared as a word line, and the word line extending in the vertical direction saves space. In addition, in the 3D memory provided according to the embodiment, the channel size can be changed in the semiconductor device by adjusting the thickness of the source or the drain, the process is simple with little influence on the size of the device.

Only three insulation layers and two metal layers alternately stacked are shown in FIG. 17A, but an embodiment of the present disclosure is not limited thereto. More layers may be stacked as required. For example, hundreds of insulation layers and hundreds of metal layers may be stacked as needed, which is not limited in the embodiments of the present disclosure.

An embodiment of the disclosure also provides an electronic device, which includes the 3D memory described in any one of the foregoing embodiments. The electronic device can be a storage device, a smart phone, a computer, a tablet computer, an artificial intelligence device, a wearable device or a mobile power supply, etc. The storage device may include a memory in a computer or the like, which is not limited here.

Figure 18:
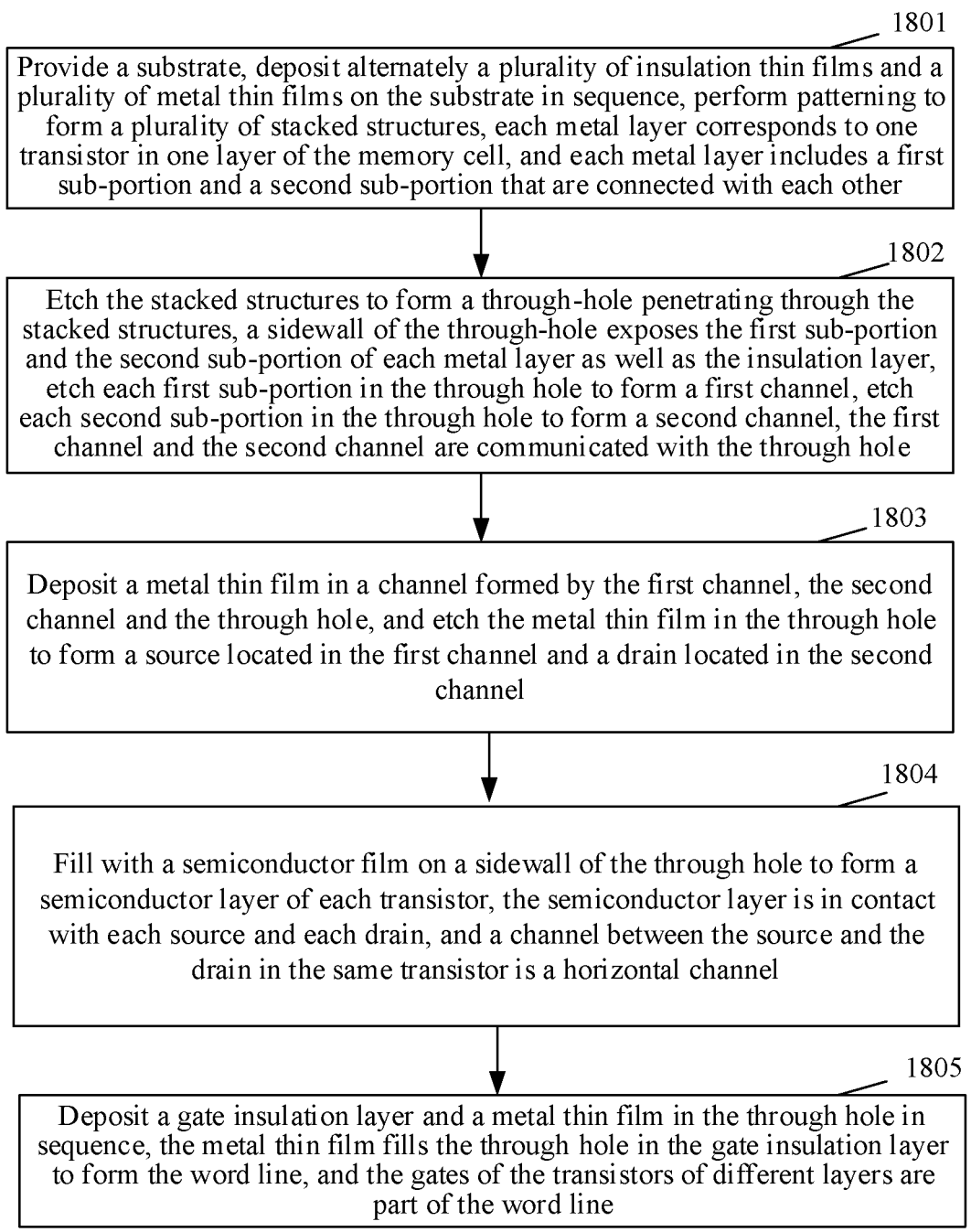
FIG. 18 is a flowchart of a manufacturing method for a semiconductor device provided according to an exemplary embodiment.

As shown in FIG. 18, an embodiment of the present disclosure provides a manufacturing method for a 3D memory. The 3D memory includes a plurality of layers of memory cells stacked in a direction perpendicular to a substrate, and a word line. The memory cell includes a transistor including a source, a drain, a gate extending in a direction perpendicular to the substrate, a semiconductor layer surrounding the gate. The manufacturing method for the 3D memory includes following acts.

In act 1801, a substrate is provided, a plurality of insulation thin films and a plurality of metal thin films are deposited alternately on the substrate in sequence, patterning is performed to form a plurality of stacked structures, wherein each of the stacked structures includes a stack of insulation layers and metal layers alternately arranged, each of the metal layers corresponds to one transistor in one layer of the memory cell, and each of the metal layers includes a first sub-portion and a second sub-portion that are connected with each other.

In act 1802, the stacked structures are etched to form a through hole penetrating through the stacked structures in a direction perpendicular to the substrate, wherein a sidewall of the through hole exposes the first sub-portion and the second sub-portion of each of the metal layers as well as the insulation layer, each first sub-portion in the through hole is etched to form a first channel, each second sub-portion in the through hole is etched to form a second channel, wherein the first channel and the second channel are communicated with the through hole.

In act 1803, a metal thin film is deposited in a channel formed by the first channel, the second channel and the through hole, and the metal thin film in the through hole is etched to form a source located in the first channel and a drain located in the second channel.

In act 1804, a semiconductor film is filled onto a sidewall of the through hole to form a semiconductor layer of each of the transistors, wherein the semiconductor layer is in contact with each of the sources and each of the drains, and a channel between the source and the drain in the same transistor is a horizontal channel.

In act 1805, a gate insulation layer and a metal thin film are deposited in the through hole in sequence, wherein the metal thin film fills the through hole in the gate insulation layer to form the word line, and the gates of the transistors of different layers are part of the word line.

After insulation thin films and metal thin films are alternately deposited, a plurality of insulation thin films and metal thin films are formed, and a thin film farthest from the substrate is an insulation thin film.

In an exemplary embodiment, before depositing the metal thin film in the channel formed by the first channel, the second channel and the through hole, the method further includes: sequentially depositing a semiconductor film and a gate insulation thin film on the sidewall of the channel formed by the first channel, the second channel and the through hole.

Etching the metal thin film in the through hole includes etching the gate insulation thin film and the metal thin film in the through hole.

The above-mentioned manufacturing process can refer to the manufacturing process of the transistor in the foregoing embodiment, and the processing for a plurality of metal thin films can be consistent with the processing for the metal thin films in the above-mentioned transistor manufacturing process, which will not be repeated here.

In the manufacturing method for the 3D memory provided according to the embodiment, the source contact region and the drain contact region on the semiconductor layer of the manufactured 3D memory are arranged so that the channel direction between the source and the drain generally extends along the direction parallel to the substrate, which is convenient for realizing the 3D stacked memory with simple structure and relatively easy fabrication. In addition, the gate of each stacked transistor can be shared as a word line, and the word line extending in the vertical direction saves space. In addition, in the 3D memory provided according to the embodiment, the channel size can be changed by adjusting the thickness of the source or the drain, the process is simple with little influence on the size of the device.

Figure 19:
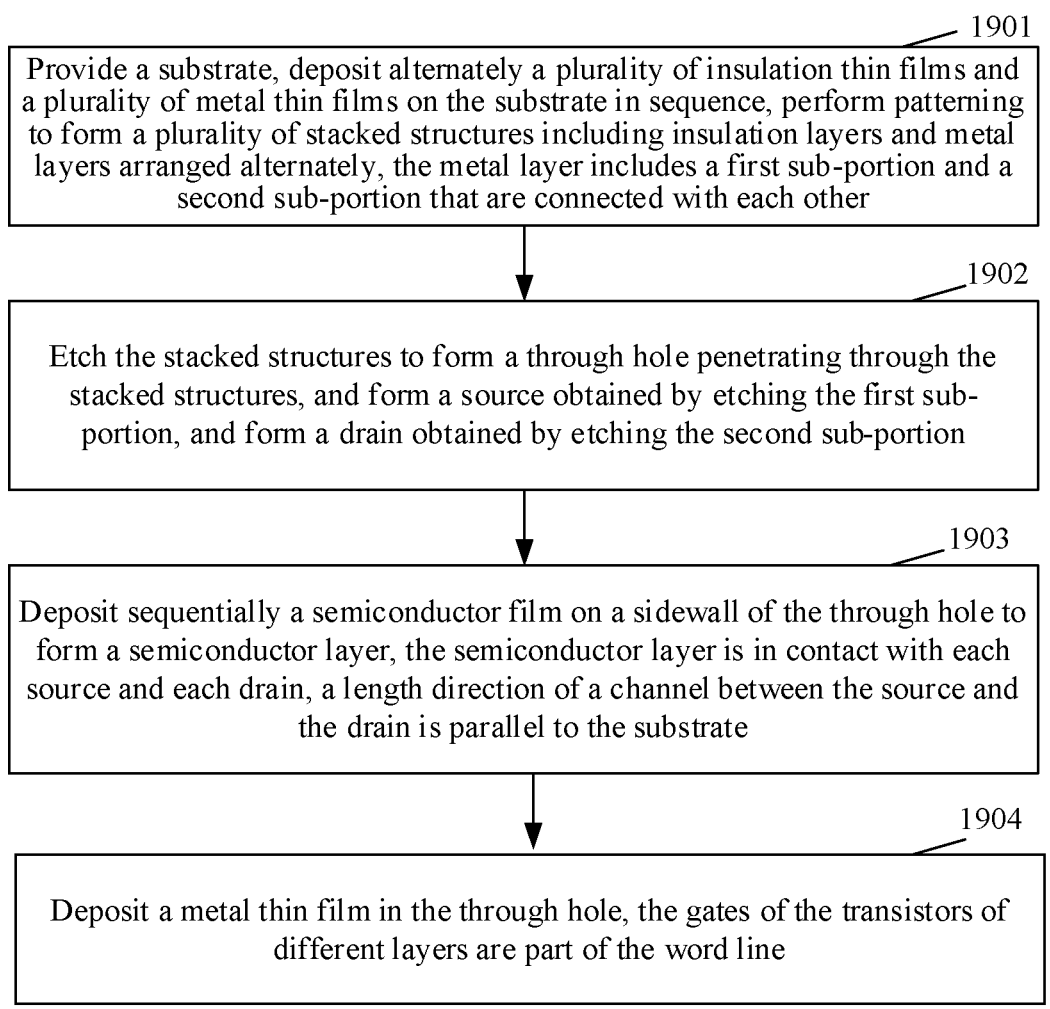
FIG. 19 is a flowchart of a manufacturing method for a semiconductor device provided according to another exemplary embodiment.

As shown in FIG. 19, an embodiment of the present disclosure provides a manufacturing method for a 3D memory. The 3D memory may include a plurality of layers of memory cells stacked in a direction perpendicular to the substrate, and a word line. The memory cell may include a transistor. The transistor may include a source, a drain, a gate extending in a direction perpendicular to the substrate, a semiconductor layer surrounding a sidewall of the gate. The manufacturing method may include following acts.

In act 1901, a substrate is provided, a plurality of insulation thin films and a plurality of metal thin films are deposited alternately on the substrate in sequence, patterning is performed to form a plurality of stacked structures, wherein each of the stacked structures includes a stack of insulation layers and metal layers alternately arranged, each of the metal layers corresponds to one transistor in one layer of the memory cell, and each of the metal layers includes a first sub-portion and a second sub-portion that are connected with each other.

In act 1902, the stacked structures are etched to form a through hole penetrating through the stacked structures in a direction perpendicular to the substrate, and a source obtained by etching the first sub-portion is formed, and a drain obtained by etching the second sub-portion is formed.

In act 1903, a semiconductor film is deposited on a sidewall of the through hole to form a semiconductor layer, wherein the semiconductor layer is in contact with each of the sources and each of the drains, a length direction of a channel between the source and the drain in the same transistor is parallel to the substrate.

In act 1904, a gate insulation layer and a metal thin film are deposited in the through hole in sequence, wherein the metal thin film fills the through hole in the gate insulation layer to form the word line, and the gates of the transistors of different layers are part of the word line.

The manufacturing method for the 3D memory provided according to the embodiment of the disclosure is convenient for realizing the 3D stacked memory with simple structure and relatively easy fabrication, and in the 3D memory provided according to the embodiment, the channel size can be changed by adjusting the thickness of the source or the drain, the process is simple with little influence on the size of the transistor. The manufacturing method according to an embodiment of the disclosure can be realized by utilizing the existing mature manufacturing equipment, it has relatively small improvement on the existing process, can be well compatible with the existing manufacturing process, is easy to realize the process, is easy to implement, and has high production efficiency, low production cost and high yield.

Embodiments of the present disclosure provide a manufacturing method for a 3D memory, wherein the 3D memory includes a plurality of memory cells stacked along a direction perpendicular to a substrate, and a word line.

The memory cell includes a transistor including a source, a drain, a gate extending in a direction perpendicular to the substrate, and a semiconductor layer surrounding the gate.

The manufacturing method of the 3D memory may include:
providing a substrate, alternately depositing a plurality of insulation thin films and a plurality of conductive thin films on the substrate in sequence, and patterning to form a plurality of stacked structures arranged at intervals in a direction parallel to the substrate, wherein each of the stacked structures includes a stack of insulation layers and conductive layers alternately arranged in the direction perpendicular to the substrate, each of the conductive layers corresponding to one transistor in one layer of the memory cell, and each of the conductive layers includes a first sub-portion and a second sub-portion that are connected with each other;
etching the stacked structures to form a through hole penetrating through the stacked structures in the direction perpendicular to the substrate, wherein a sidewall of the through hole exposes the first sub-portion and the second sub-portion of each of the conductive layers and the insulation layer; etching each of the first sub-portions in the through hole to form a plurality of first channels corresponding to a plurality of transistors, and etching each of the second sub-portions in the through hole to form a plurality of second channels corresponding to a plurality of transistors, wherein each of the first channels and each of the second channels are arranged at intervals and respectively communicated with the through hole;
depositing a metal thin film in a channel formed by each of the first channels, each of the second channels and the through hole, and etching to remove the metal thin film in the through hole to retain the metal thin film layer in each of the first channels and each of the second channels to form a plurality of sources located in a plurality of the first channels and a plurality of drains located in a plurality of the second channels;
filling with a semiconductor film on a sidewall of the through hole to form a semiconductor layer of each of the transistors, wherein the semiconductor layer is in contact with each of the sources and each of the drains, and a channel between the source and the drain in the same transistor is a horizontal channel; and
depositing a gate insulation layer and a metal thin film in the through hole in sequence, wherein the metal thin film fills the through hole in the gate insulation layer to form the word line, and the gates of the transistors of different layers are part of the word line.

Although implementations disclosed in the present disclosure are as described above, the described contents are only implementations used for facilitating understanding of the present disclosure, but are not intended to limit the present disclosure. Without departing from the spirit and scope disclosed in the present disclosure, any person skilled in the art to which the present disclosure belongs may make any modifications and changes in the form and details of implementation, but the scope of patent protection of the present disclosure shall still be defined by the appended claims.

The invention claimed is:
1. A 3D memory, comprising:
a plurality of layers of memory cells and a plurality of insulation layers stacked alternately in a first direction; wherein a memory cell of each layer comprises a conductive film layer, and the first direction is perpendicular to a substrate;

a hole penetrating through each of the insulation layers and each of the conductive film layers in the first direction;

a semiconductor layer extending onto a sidewall of the hole; wherein the semiconductor layer is a metal oxide semiconductor layer; and a word line, wherein the word line is located in the hole, extends in the first direction and penetrates through the plurality of layers of memory cells, and is insulated from the semiconductor layer;

wherein the memory cell comprises a transistor, the transistor comprises a source, a drain in the conductive film layer, a gate which is part of the word line and extends in the first direction, wherein the gate is surrounded by the semiconductor layer, the semiconductor layer comprises a source contact region and a drain contact region arranged at intervals, a channel between the source contact region and the drain contact region is a horizontal channel; the source extends in a second direction and the drain extends in a third direction, the second direction is parallel to the substrate and the third direction is parallel to the substrate, and the second direction and the third direction intersect with each other; the conductive film layer comprises a sub-portion extending in the third direction, and an end of the source away from the semiconductor layer is surrounded by the sub-portion; and transistors of different layers share one semiconductor layer.

2. The 3D memory according to claim 1, wherein sources of transistors of different layers are arranged at intervals, and drains of transistors of different layers are arranged at intervals.

3. The 3D memory according to claim 1, wherein a sidewall of the word line is surrounded by a gate insulation layer, and a sidewall of the gate insulation layer is surrounded by the semiconductor layer.

4. The 3D memory according to claim 1, wherein the source and the drain of a same transistor are located in a same conductive film layer, sources or drains of different transistors are located in different conductive film layers.

5. The 3D memory according to claim 1, wherein orthographic projections of the source and the drain of a same transistor are not overlapped on a plane parallel to the substrate, orthographic projections of sources and drains of different transistors are not overlapped on a plane parallel to the substrate.

6. The 3D memory according to claim 1, wherein the source is located at a first side of the gate, the drain is located at a second side of the gate, and the source and the drain are disposed oppositely.

7. The 3D memory according to claim 1, wherein every two adjacent semiconductor layers in the memory cells of different layers are connected as an integrated structure.

8. The 3D memory according to claim 1, wherein the semiconductor layer completely or partially surrounds the gate.

9. The 3D memory according to claim 8, wherein the source and the drain are located in a same conductive film layer, the conductive film layer is parallel to the substrate.

10. The 3D memory according to claim 8, wherein an orthographic projection of the source and an orthographic projection of the drain on a plane parallel to the substrate are not overlapped.

11. The 3D memory according to claim 8, wherein the source contact region is located at a first side of the semiconductor layer, the drain contact region is located at a second side of the semiconductor layer, the source is in contact with the source contact region, the drain is in contact with the drain contact region, and the source and the drain are disposed oppositely.

12. A method for manufacturing a 3D memory according to claim 1, wherein, a 3D memory comprises a plurality of layers of memory cells stacked in a first direction, and a word line, and the first direction is perpendicular to a substrate;

a memory cell comprises a transistor, the transistor comprises a source, a drain, a gate extending in the first direction, and a semiconductor layer surrounding the gate; the manufacturing method for the 3D memory comprises:

providing a substrate, depositing a plurality of insulation thin films and a plurality of conductive thin films alternately on the substrate in sequence, and patterning to form a plurality of stacked structures, wherein each of the stacked structures comprises a stack of insulation layers and conductive film layers arranged alternately, each of the conductive film layers corresponds to one transistor in the memory cell of one layer, and each of the conductive film layers comprises a second sub-portion and a third sub-portion which are opposite to each other, and a first sub-portion connecting the second sub-portion and the third sub-portion;

etching the stacked structures to form a through hole penetrating through the stacked structures in the first direction, wherein a sidewall of the through hole exposes the first sub-portion and the second sub-portion of each of the conductive film layers and the insulation layer; etching each of first sub-portions in the through hole to form a first channel, and etching each of second sub-portions in the through hole to form a second channel, wherein the first channel and the second channel are communicated with the through hole;

depositing a metal thin film in a channel formed by the first channel, the second channel and the through hole, and etching the metal thin film in the through hole to form a source located in the first channel and a drain located in the second channel; wherein the source extends in a second direction and the drain extends in a third direction, the second direction is parallel to the substrate and the third direction is parallel to the substrate, and the second direction and the third direction intersect with each other;

filling with a semiconductor film on a sidewall of the through hole to form a semiconductor layer of each of the transistors, wherein the semiconductor layer is in contact with each of the sources and each of the drains, a channel between the source and the drain in a same transistor is a horizontal channel, an end of the source away from the semiconductor layer is surrounded by the third sub-portion, and the third sub-portion extends in the third direction; and transistors of different layers share one semiconductor layer; and depositing a gate insulation layer and a metal thin film in the through hole in sequence, wherein the metal thin film fills the through hole in the gate insulation layer to form the word line, and gates of transistors of different layers are part of the word line.

13. An electronic device comprising the 3D memory according to claim 1.

* * * * *